United States Patent
Fujimoto et al.

(10) Patent No.: US 8,368,102 B2
(45) Date of Patent: Feb. 5, 2013

(54) LIGHT EMITTING DEVICE

(75) Inventors: Tetsuji Fujimoto, Hitachi (JP); Kazuyuki Ilzuka, Hitachi (JP); Masahiro Watanabe, Hitachi (JP); Katsuya Akimoto, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 41 days.

(21) Appl. No.: 12/805,290

(22) Filed: Jul. 22, 2010

(65) Prior Publication Data

US 2011/0024781 A1 Feb. 3, 2011

(30) Foreign Application Priority Data

Jul. 30, 2009 (JP) .................. 2009-177219

(51) Int. Cl.
- *H01L 33/10* (2010.01)
- *H01L 33/20* (2010.01)
- *H01L 33/22* (2010.01)

(52) U.S. Cl. .............. 257/98; 257/99; 257/E33.065; 257/E33.066; 257/E33.067

(58) Field of Classification Search .......... None
See application file for complete search history.

(56) References Cited

U.S. PATENT DOCUMENTS

| | | | | |
|---|---|---|---|---|
| 6,809,340 B2 * | 10/2004 | Kato et al. | ...................... | 257/79 |
| 7,504,667 B2 * | 3/2009 | Fujikura et al. | ................. | 257/98 |
| 2004/0238837 A1 * | 12/2004 | Jacob et al. | ...................... | 257/99 |
| 2007/0102711 A1 | 5/2007 | Aoyagi et al. | | |
| 2008/0265267 A1 * | 10/2008 | Unno | .............................. | 257/98 |
| 2009/0072257 A1 * | 3/2009 | Unno et al. | ..................... | 257/98 |
| 2010/0203661 A1 * | 8/2010 | Hodota | ........................... | 438/29 |

FOREIGN PATENT DOCUMENTS

| | | | |
|---|---|---|---|
| JP | 2003-110134 A | | 4/2003 |
| JP | 2006-24701 A | | 1/2006 |
| WO | WO-2009/004980 A1 | * | 1/2009 |

\* cited by examiner

*Primary Examiner* — Johannes P Mondt
(74) *Attorney, Agent, or Firm* — McGinn IP Law Group, PLLC

(57) ABSTRACT

A light emitting device has a light emitting layer having a first semiconductor layer of a first conductivity type, a second semiconductor layer of a second conductivity type different from the first conductivity type, and an active layer sandwiched between the first semiconductor layer and the second semiconductor layer, a reflecting layer provided on a side of one surface of the light emitting layer, which reflects a light emitted from the active layer, a supporting substrate provided on an opposite side of the reflecting layer with respect to the light emitting layer, which supports the light emitting layer via an adhesion layer, an ohmic contact portion provided on a part of the reflecting layer, which electrically connects between the reflecting layer and the light emitting layer, and convexo-concave portions formed on other surface of the light emitting layer and side surfaces of the light emitting layer, respectively, and an insulating film configured to cover the convexo-concave portions.

15 Claims, 28 Drawing Sheets

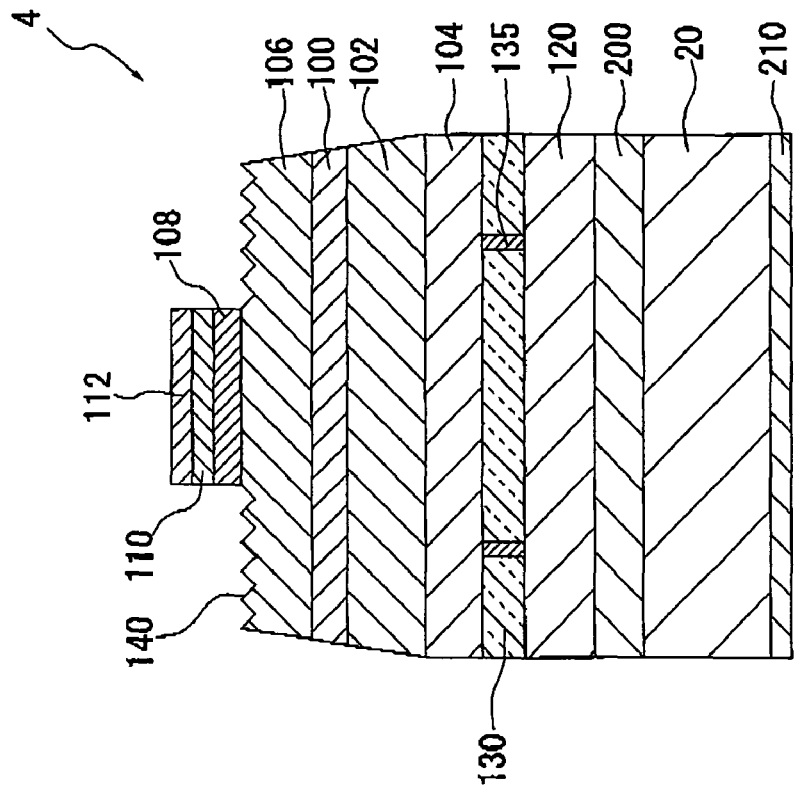

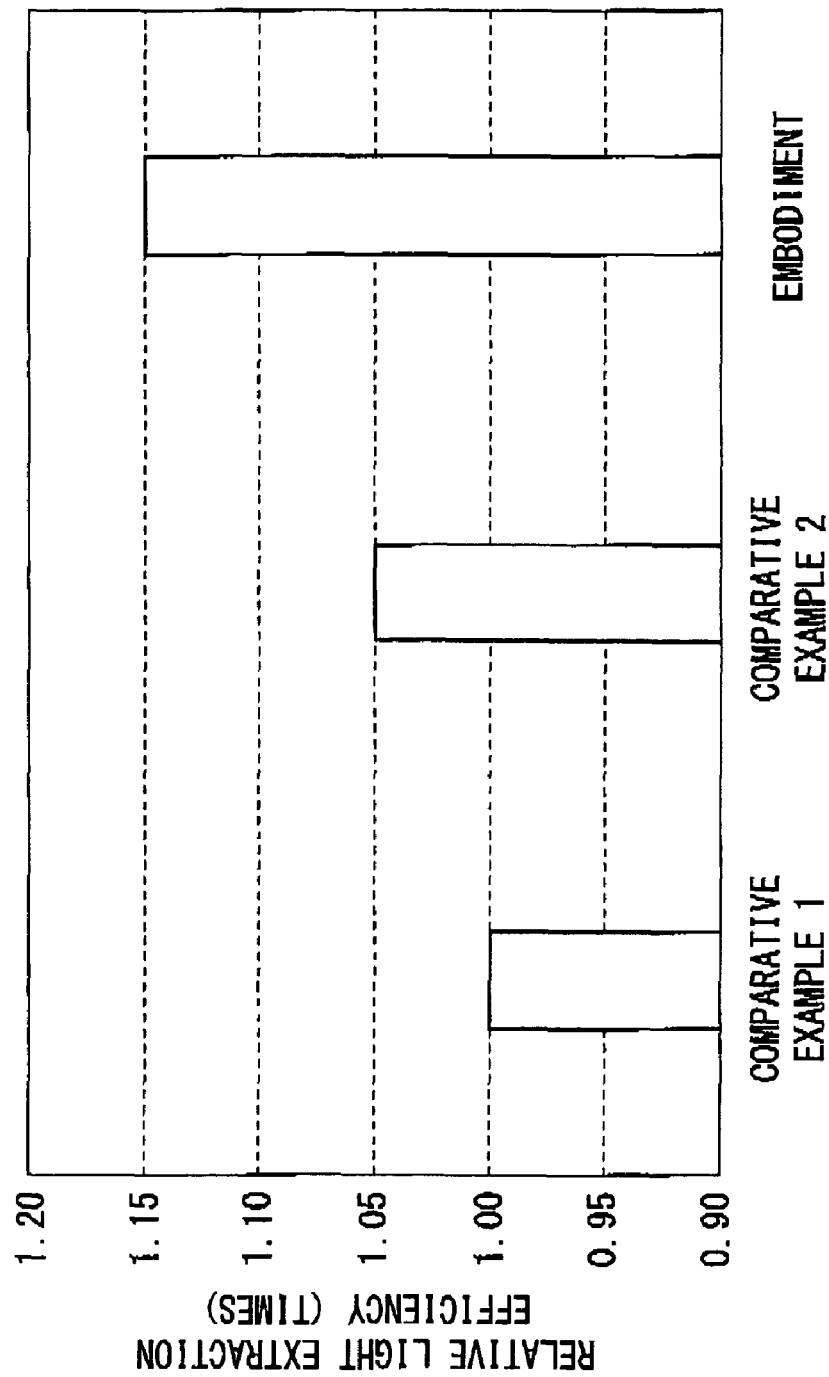

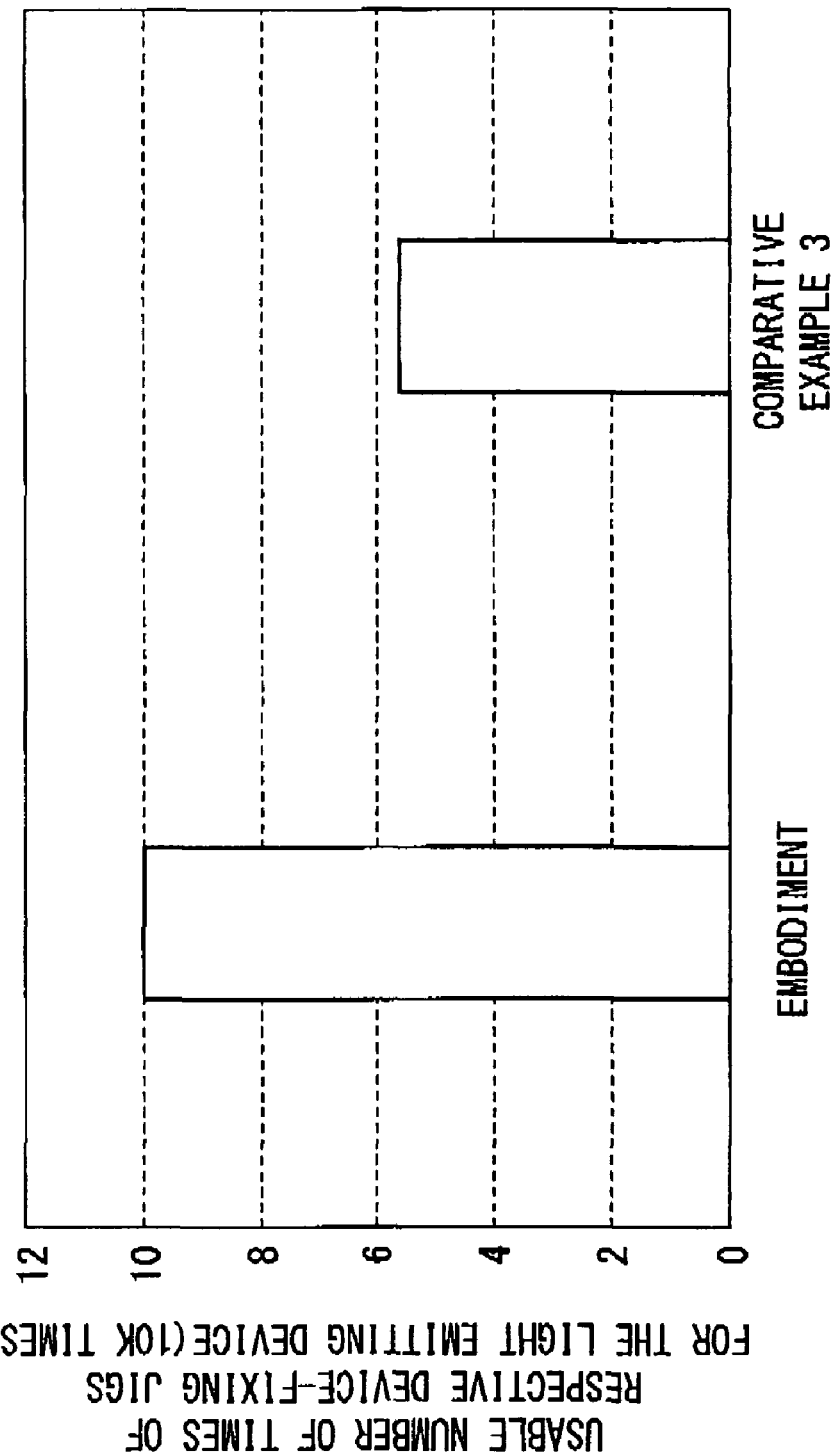

- 104
- 102
- 100
- 106
- 108
- 109 ETCHING STOPPER LAYER
- 15 GaAs SUBSTRATE

- 135  130a
- 130
- 104
- 102
- 100
- 106
- 108
- 109
- 15

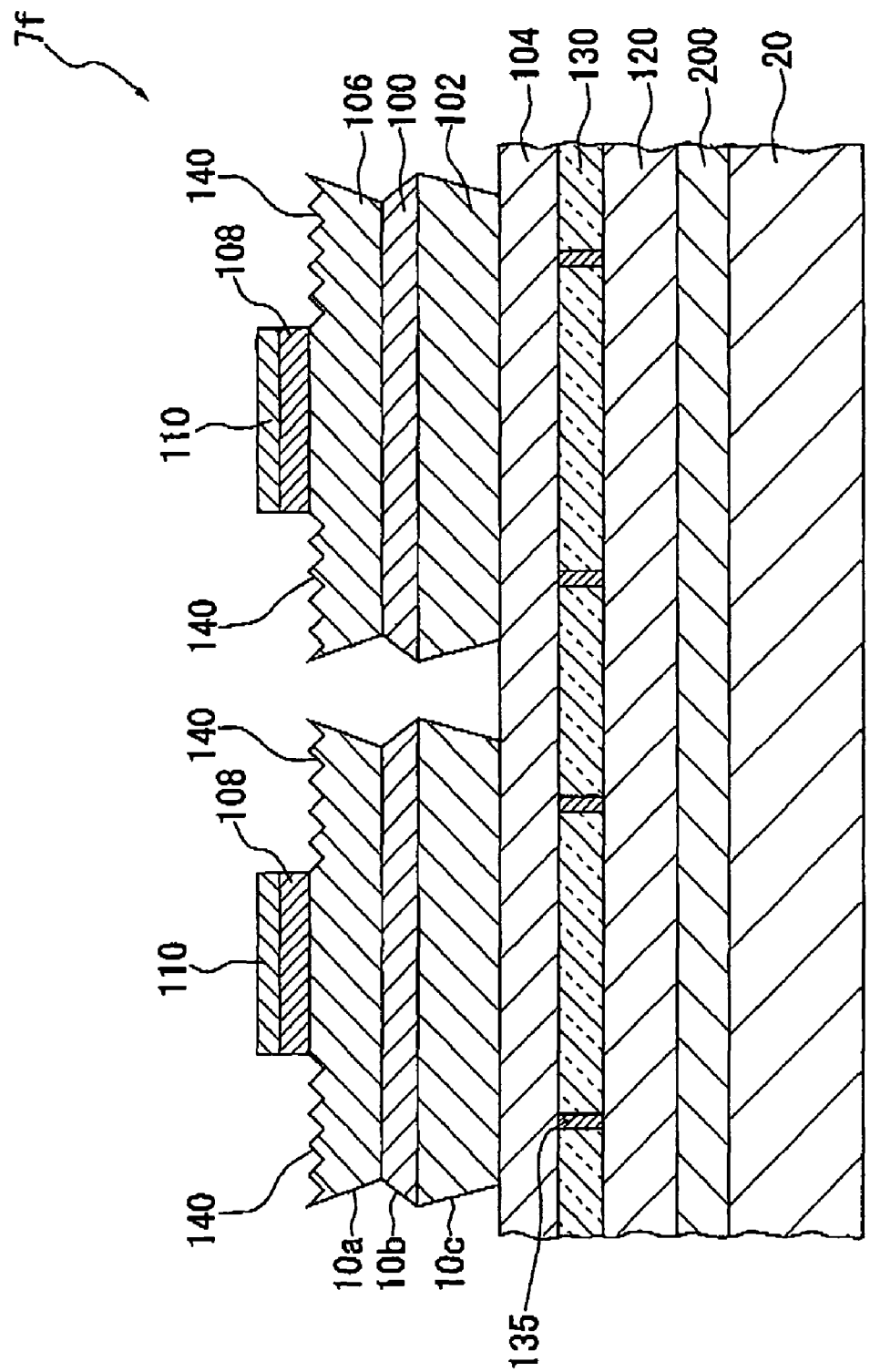

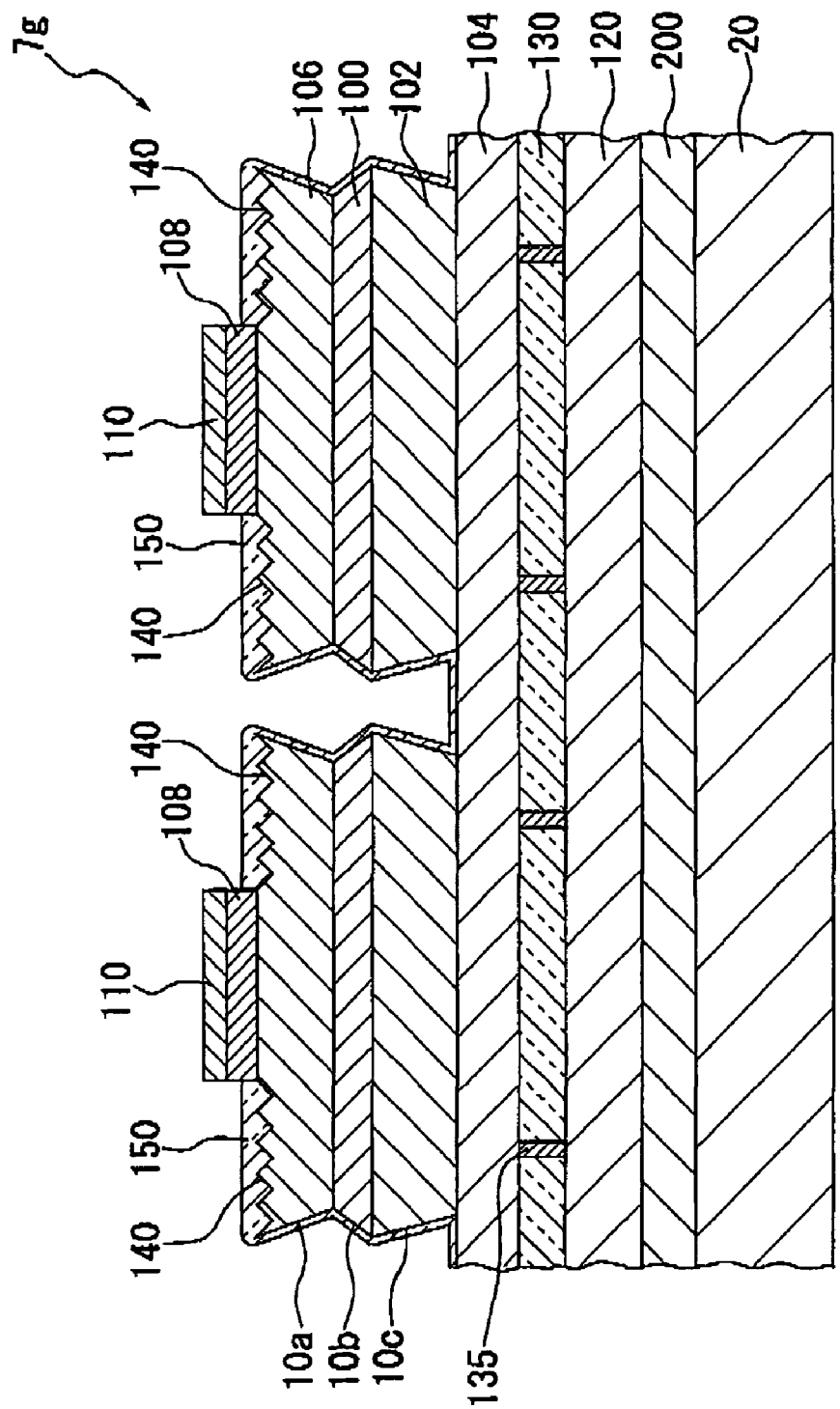

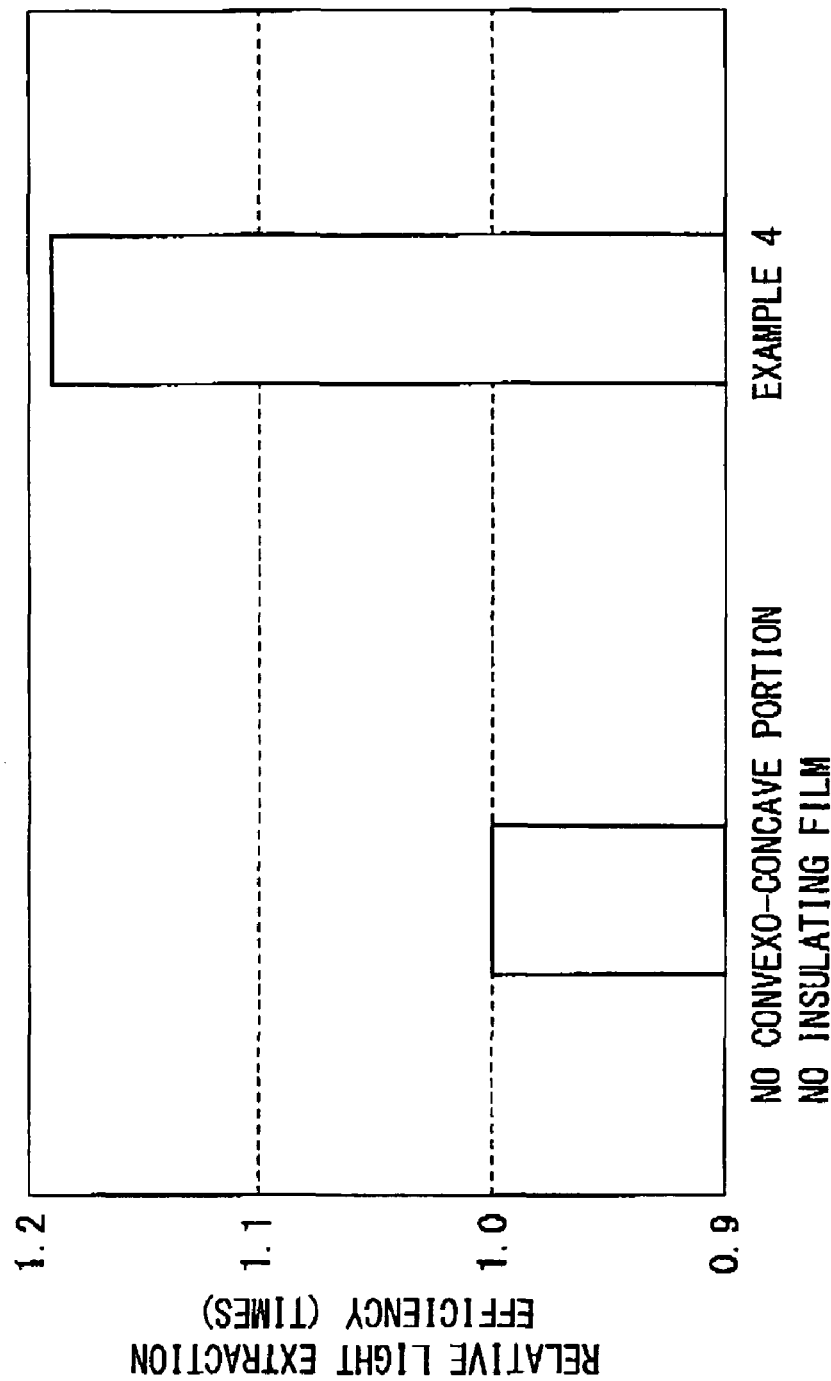

LIGHT EMITTING DEVICE

The present application is based on Japanese Patent Application No. 2009-177219 filed on Jul. 30, 2009, the entire contents of which are incorporated herein by reference.

BACKGROUND OF THE INVENTION

1. Field of the Invention

The present invention relates to a light emitting device, in more particular, to a light emitting device with high light emitting efficiency.

2. Related Art

As a conventional light emitting device, a light emitting device comprising a supporting substrate, a light reflecting layer provided on one main surface of the supporting substrate, the light reflecting layer comprising silver (Ag) or a silver (Ag) alloy, a semiconductor region including a plurality of semiconductor layers necessary for light emission, the semiconductor region having one main surface which is electrically connected to the light reflecting layer and another main surface for extracting a light, and an electrode which is electrically connected to the other main surface of the semiconductor region has been known. Japanese Patent Laid-Open No. 2006-24701 (JP-A 2006-24701) discloses one example of the conventional light emitting devices.

In the light emitting device disclosed by JP-A 2006-24701, the light reflecting layer reflects the light emitted from the active layer regardless an incident angle of the light. Therefore, it is possible to provide the light emitting device with excellent optical output efficiency.

When mounting a light emitting device on a stem or the like, it is necessary to take out the light emitting device by adsorbing the light emitting device which is stuck to an adhesive sheet. In such case, a jig such as collet made of rubber, resin, ceramic, metal or the like is used. In the light emitting device disclosed by JP-A 2006-24701, mechanical strength of numerous convexo-concaves formed on the main surface is extremely low, as obviously understood from their configurations. Further, mechanical strength of the semiconductor region including the semiconductor layers is not enough, since a thickness of the semiconductor region is very thin. Therefore, in the case of mounting the light emitting device of JP-A 2006-24701 by using the collet, there is a disadvantage in that the light emitting device may be mechanically damaged due to the contact of the collet to the light emitting device, thereby causing malfunction such as damage of the active layer, reduction in lifetime of the light emitting device, electric leakage (leakage of electricity), or failure in light emitting pattern.

SUMMARY OF THE INVENTION

Accordingly, an object of the invention is to provide a light emitting device with high light emitting efficiency as well as high reliability.

According to a feature of the invention, a light emitting device comprises:

a light emitting layer having a first semiconductor layer of a first conductivity type, a second semiconductor layer of a second conductivity type different from the first conductivity type, and an active layer sandwiched between the first semiconductor layer and the second semiconductor layer;

a reflecting layer provided on a side of one surface of the light emitting layer, which reflects a light emitted from the active layer;

a supporting substrate provided on an opposite side of the reflecting layer with respect to the light emitting layer, which supports the light emitting layer via an adhesion layer;

an ohmic contact portion provided on a part of the reflecting layer, which electrically connects between the reflecting layer and the light emitting layer; and convexo-concave portions formed on other surface of the light emitting layer and side surfaces of the light emitting layer, respectively; and an insulating film configured to cover the convexo-concave portions.

The insulating film may transmit the light emitted from the active layer.

The light emitting device may further comprise:

a contact layer of the first conductivity type provided between the light emitting layer and the reflecting layer, in which the insulating film is provided only on a predetermined region of the other surface of the light emitting layer and the side surfaces of the light emitting layer.

The light emitting layer may comprise a mesa structure and a reverse mesa structure, and the insulating film is preferably provided along the mesa structure and the reverse mesa structure.

A width of the light emitting layer is preferably narrower than a width of the supporting substrate.

The light emitting device may further comprise:

a surface electrode provided on an opposite side of the light emitting layer with respect to the reflecting layer, in which the ohmic contact portion is formed on a part of a region except a region right under the surface electrode when viewed from the other surface of the light emitting layer toward the active layer.

The light emitting device may further comprise:

a dielectric layer provided between the reflecting layer and the light emitting layer, which transmits the light emitted from the active layer, wherein the ohmic contact portion is formed within an opening penetrating through a part of the dielectric layer, and electrically connects between the contact layer and the reflecting layer.

The insulating film may comprise insulating layers having refractive indices different from each other, and the insulating layers may be laminated such that the refractive indices of the insulating layers are reduced in a sequential order along a direction distant from the other surface of the light emitting layer and the side surfaces of the light emitting layer.

Advantages of the Invention

According to the light emitting device of the present invention, it is possible to provide a light emitting device with high light emitting efficiency as well as high reliability.

BRIEF DESCRIPTION OF THE DRAWINGS

Next, the light emitting device in embodiments according to the invention will be explained in conjunction with appended drawings, wherein:

FIG. 2A is a cross sectional view of a light emitting device in a comparative example 1;

FIG. 2B is a cross sectional view of a light emitting device in a comparative example 2;

FIG. 2C is a graph showing a comparison between a relative light extraction efficiency of the light emitting device in the embodiment according to the invention and a relative light extraction efficiency of the light emitting device in the comparative example 2, with respect to a light extraction efficiency of the light emitting device in the comparative example 1 as a reference;

FIG. 2F is a graph showing usable number of times of respective device-fixing jigs for the light emitting device in the embodiment according to the present invention and the light emitting device in the comparative example 3;

FIG. 3J is a diagram showing the manufacturing process of the light emitting device in the embodiment according to the invention;

FIG. 3K is a diagram showing the manufacturing process of the light emitting device in the embodiment according to the invention;

FIG. 9 is a graph showing a relative light extraction efficiency of the light emitting device in Example 4 compared with a light emitting device with no convexo-concave portion and no insulating film as a reference.

DETAILED DESCRIPTION OF THE EMBODIMENT

Next, the embodiment according to the present invention will be explained in more detail in conjunction with the appended drawings.

The Embodiment

Figure 1A:
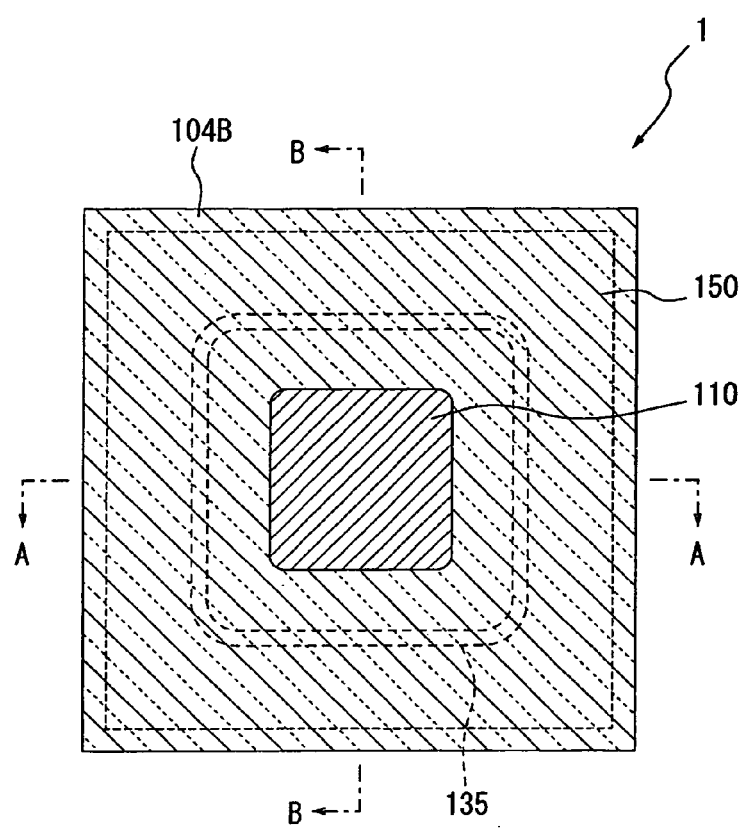
FIG. 1A is a schematic top plan view of a light emitting device in an embodiment according to the invention.
Figure 1B:
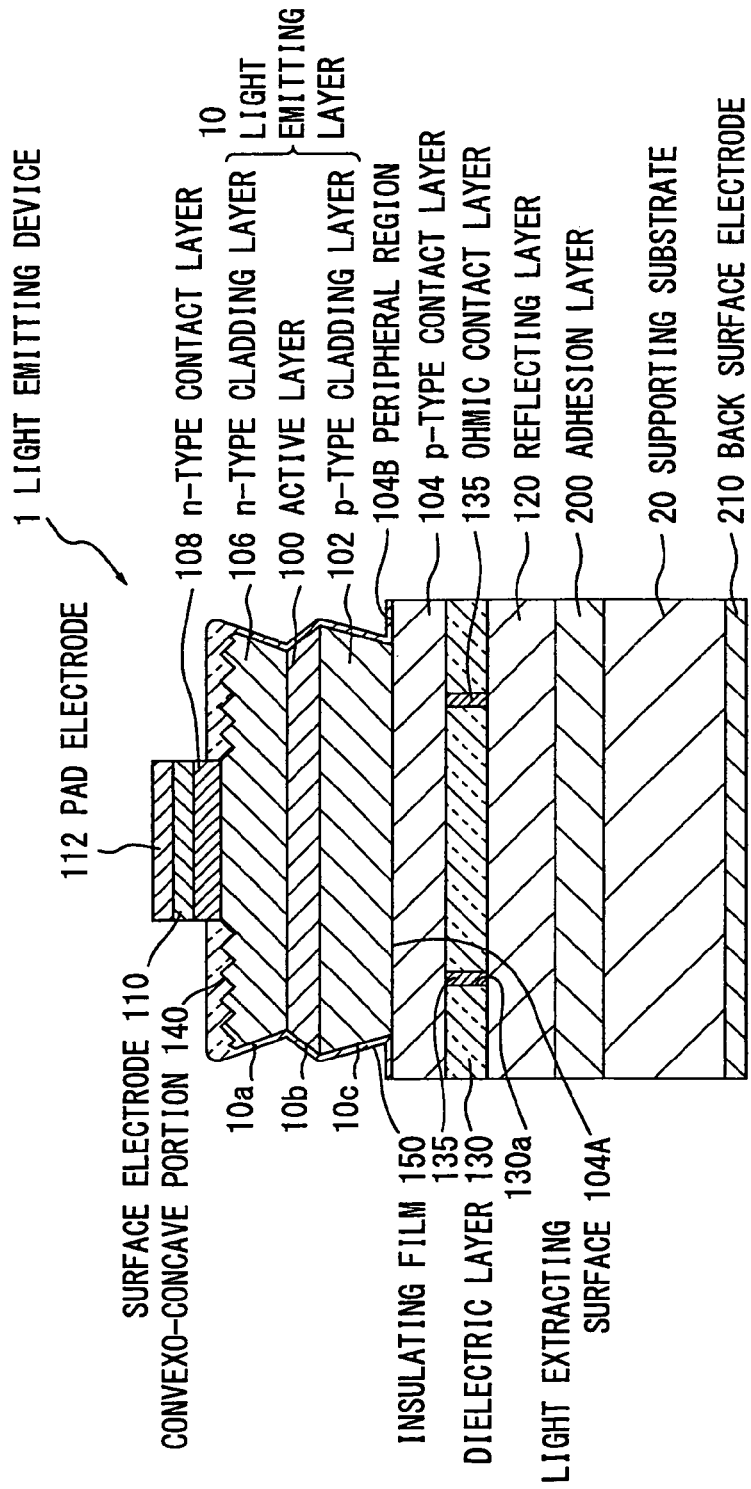
FIG. 1B is a schematic cross sectional view of the light emitting device along A-A line in the embodiment according to the invention.
Figure 1C:
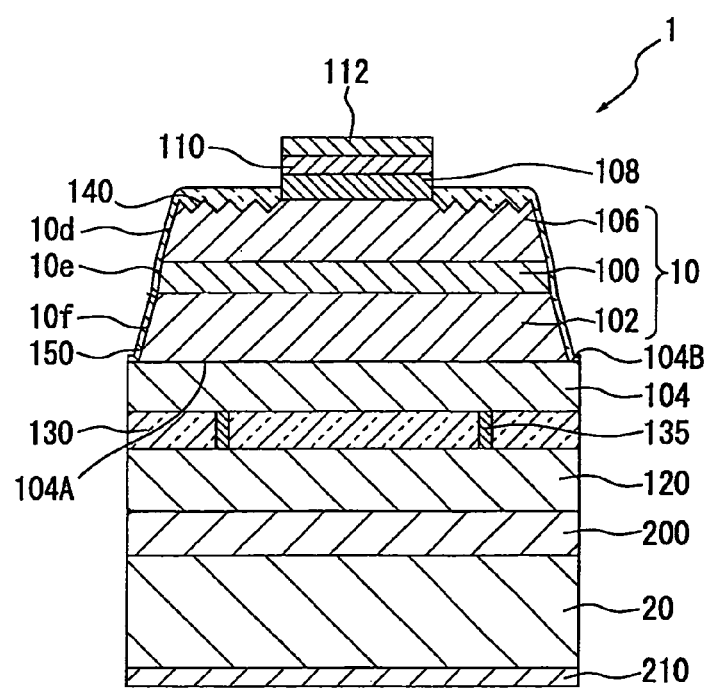
FIG. 1C is a schematic cross sectional view of the light emitting device along B-B line in the embodiment according to the invention.

FIG. 1A is a schematic top plan view of a light emitting device in an embodiment according to the invention. FIG. 1B is a schematic cross sectional view of the light emitting device along A-A line in the embodiment according to the invention. FIG. 1C is a schematic cross sectional view of the light emitting device along B-B line in the embodiment according to the invention.

(Outline of a Structure of the Light Emitting Device 1)

Referring to FIG. 1B, a light emitting device 1 comprises a light emitting layer 10 having a p-type cladding layer 102 as a first semiconductor layer having a first conductivity type, an n-type cladding layer 106 as a second semiconductor layer having an active layer 100 which emits a light with a predetermined wavelength, an n-type cladding layer 106 as a second semiconductor layer having a second conductivity type which is different from the first conductivity type, an active layer 100 which is sandwiched between the p-type cladding layer 102 and the n-type cladding layer 106 and which can emit a light with a predetermined wavelength, a reflecting layer 120 which is provided on a side of one surface of the light emitting layer 10 and made of metal reflecting the light emitted from the active layer 100, a supporting substrate 20 which is provided on an opposite side of the reflecting layer 120 with respect to the light emitting layer 10 and supports the light emitting layer 10 via an adhesion layer 200, the supporting substrate having electric conductivity, an ohmic contact portion 135 which electrically connects the reflecting layer 120 and the light emitting layer 10, convexo-concave portions 140 which are formed on other surface of the light emitting layer 10 and side surfaces of the light emitting layer 10 respectively, and an insulating film 150 which is configured to cover the convexo-concave portion 140 of the other surface of the light emitting layer 10 and the convexo-concave portions 140 of the side surfaces of the light emitting layer 10.

Herein, for explanation purposes, the convexo-concave portions 140 formed on the side surfaces of the light emitting layer 10 are not illustrated in FIG. 1B and FIG. 1C.

The light emitting device 1 further comprises an n-type contact layer 108 which is formed on a part of a surface of the n-type cladding layer 106 on an opposite side with respect to the active layer 100, a surface electrode 110 which is formed on a surface of the light emitting layer 10 on an opposite side with respect to the reflecting layer 120, namely, on the n-type contact layer 108, a pad electrode 112 which is formed on the surface electrode 110 as a wire-bonding pad, a p-type contact layer 104 which is formed as a contact layer between the light emitting layer 10 and the reflecting layer 120, a dielectric layer 130 which is formed on a region except a region where the ohmic contact portion 135 is provided and between the light emitting layer 10 and the reflecting layer 120, more concretely, between the p-type contact layer 104 and the reflecting layer 120, and a back surface electrode 210 provided on a surface of the supporting substrate 20 on an opposite side with respect to a surface bonded to an adhesion layer 200. In addition, configuration of the side surfaces of the light emitting layer 10 is formed by wet etching, as explained in more detail later as to fabrication process of the light emitting device 1.

More concretely, as shown in FIG. 1B, a reverse mesa structure 10a, a reverse mesa structure 10c, and a mesa structure 10b are formed on a part of the side surfaces of the light emitting layer 10. In other words, a part of side surfaces of the p-type cladding layer 102 and a part of side surfaces of the n-type cladding layer 106 are formed to have a reverse mesa shape, and side surfaces of the active layer 100 are formed to have a mesa shape in the present embodiment. In addition, an inclination of the reverse mesa structure 10a with respect to the surface of the p-type contact layer 104 and an inclination of the reverse mesa structure 10c with respect to the surface of the p-type contact layer 104 are equal to each other. In addition, referring to FIG. 1C, all of side surfaces of the p-type cladding layer 102, the n-type cladding layer 106 and the active layer 100 are formed to have a mesa shape (i.e. a mesa structure 10d, a mesa structure 10e, and a mesa structure 10f) at the side surfaces of the light emitting layer 10 that are perpendicular to the side surfaces of the light emitting layer 10 having the reverse mesa shape.

In addition, as shown in FIG. 1A, the light emitting device 1 in the embodiment is formed to be substantially square in a top plan view. As an example, plane dimensions of the light emitting device 1 are a vertical length of 200 µm and a lateral length of 200 µm, respectively. Further, a thickness of the light emitting device 1 is formed to be about 200 µm. Still further, for example, the light emitting device 1 in the embodiment may be composed as a light emitting device in which the plane dimensions are 300 µm×300 µm or more, or a light emitting device with a large-scale chip size in which the plane dimensions are 500 µm×500 µm or more.

(Light Emitting Layer 10, P-Type Contact Layer 104, and N-Type Contact Layer 108)

Each of the light emitting layer 10, the p-type contact layer 104, and the n-type contact layer 108 in the embodiment comprises a III-V group compound semiconductor. More concretely, each of the light emitting layer 10, the p-type contact layer 104, and the n-type contact layer 108 in the embodiment may comprise a compound semiconductor such as GaAs-based compound semiconductor, GaP-based compound semiconductor, InP-based compound semiconductor, ternary compound semiconductor such as InGaAs-based compound semiconductor, InGaP-based compound semiconductor, AlGaAs-based compound semiconductor, and quaternary compound semiconductor such as AlGaInP-based compound semiconductor. For example, the light emitting layer 10 has a configuration in which the active layer 100 comprising an undoped AlGaInP-based compound semiconductor bulk which is not doped with a dopant of an impurity is sandwiched between the n-type cladding layer 106 comprising an n-type AlGaInP and the p-type cladding layer 102 comprising a p-type AlGaInP.

The active layer 100 emits the light with the predetermined wavelength when the electric current is supplied from the outside to the active layer 100. For example, the active layer 100 comprises a compound semiconductor which emits a red light with a wavelength of around 624 nm. The n-type cladding layer 106 contains a predetermined concentration of an n-type dopant such as Si and Se. The p-type cladding layer 104 contains a predetermined concentration of a p-type dopant such as Zn and Mg. Furthermore, the p-type contact layer 104 of the light emitting layer 10 comprises e.g. a p-type GaP layer doped with Mg at a predetermined concentration. The n-type contact layer 108 comprises e.g. a GaAs layer doped with Si at a predetermined concentration. The n-type contact layer 108 is provided at a region in which at least the surface electrode 110 is provided on an upper surface of the n-type cladding layer 106.

(Dielectric Layer 130 and Ohmic Contact Portion 135)

The dielectric layer 130 is provided at a region where the ohmic contact portion 135 is not provided and on the surface of the p-type contact layer 104. The ohmic contact portion 135 is formed within an opening penetrating through a part of the dielectric layer 130, to electrically connect the p-type contact layer 104 with the reflecting layer 120. As an example, the ohmic contact part 135 comprises a metallic material including Au and Zn, e.g. AuZn alloy.

The dielectric layer 130 comprises a transparent material which has a refractive index lower than a refractive index of a material composing the light emitting layer 10 and transmits a light with the wavelength of the light emitted from the active layer 100. As an example, the dielectric layer 130 comprises a transparent dielectric layer such as $SiO_2$, $SiN_x$. In addition, the dielectric layer 130 is formed to have a thickness of $(2\times\lambda)/(4\times n)$ or more, wherein the wavelength of the light emitted from the active layer 100 is $\lambda$, and the refractive index of the material composing the dielectric layer 130 is n. In addition, the dielectric layer 130 may comprise a transparent conductor layer including a metal oxide material such as ITO (Indium Tin Oxide) having a lower electric conductivity than an electric conductivity of the ohmic contact portion 135.

In addition, the dielectric layer 130 may comprises a layered structure of thin films comprising a plurality of materials having refractive indices different from each other. For example, the dielectric layer 130 may comprise a Distributed Bragg Reflector (DBR) structure. As an example, the dielectric layer 130 having the DBR structure in which paired layers each of which comprises a layer comprising $SiO_2$ with a predetermined film thickness and a layer comprising $TiO_2$ with a predetermined film thickness pair may be formed.

(Convexo-Concave Portion 140)

A surface of the light emitting layer 10, more concretely, a part of a surface of the light emitting layer 10 on an opposite side with respect to a surface contacting with the active layer 100 of the n-type cladding layer 106 is provided as a light extracting surface 104A, as shown in FIG. 1B. A series of the convexo-concave portions 140 each of which comprises a pair of one convex portion and one concave portion are sequentially formed on the light extracting surface of the n-type cladding layer 106. For example, one concave portion and other concave portion, or one convex portion and other convex portion are formed with a predetermined interval on the surface of the n-type cladding layer 106. In addition, the convexo-concave portions 140 may be formed by arranging concave portions and convex portions randomly on the surface of the light emitting layer 10. Furthermore, in the present embodiment, the convexo-concave portions 140 are formed on the side surfaces of the light emitting layer 10 (i.e. the side surfaces of the active layer 100, the side surfaces of the p-type cladding layer 102 and the side surfaces of the n-type cladding layer 106). The convexo-concave portion 140 is formed with a convexo-concave shape with an arithmetic mean roughness of 100 nm or more, and has a function of improving the light extraction efficiency of the light emitting device 1.

(Insulating Film 150)

The insulating film 150 as a transparent layer of the light emitting device 1 in the present embodiment comprises a transparent material with respect to the light emitted from the active layer 100 (i.e. a material which transmits the light emitted from the active layer 100). The insulating film 150 is provided on a part of the surface of the light emitting layer 10 (i.e. the region except a part where the surface electrode 110 and the pad electrode 112 are provided), and provided along the side surfaces of the light emitting layer 10 and on a peripheral region of an upper main surface of the contact layer 104, said upper main surface comprising a light extracting surface of the contact layer 104 (see FIG. 1B). In other words, the insulating film 150 is provided along the surfaces of the mesa structure and the reverse mesa structure formed on the side surfaces of the light emitting layer 10. In addition, since the insulating film 150 is formed on the side surfaces of the light emitting layer 10, the insulating film 150 comprises a material having electrical insulation property. More concretely, in the present embodiment, the light emitting layer 10 includes the active layer 100, the n-type cladding layer 106 and the p-type cladding layer 102, and the active layer 100 is sandwiched by the p-type cladding layer 102 and the n-type cladding layer 106. The insulating film 150 is formed on a part of the surface of the light emitting layer 10 and the side surfaces of the light emitting layer 10 among respective semiconductor layers formed by epitaxial growth, so that the insulating film 150 comprises the material having electric insulation property.

The insulating film 150 may comprise e.g. silicon dioxide, silicon nitride. In addition, the insulating film 150 may comprise a multilayer film comprising a plurality of insulating layers having refractive indices different from each other, namely a multilayer film in which silicon dioxide layers and silicon nitride layers are laminated. The multilayer film as the plurality of insulating layers may be formed by laminating the insulating layers in which refractive indices of the respective layers are reduced in a sequential order along direction distant from the other surface (i.e. the light-extracting surface) of the light emitting layer 10 and the side surfaces of the light emitting layer 10.

More concretely, the insulating film 150 may include films of the number x (x is a positive integer). For example, at first, a first film comprising silicon dioxide may be formed on the side surfaces of the light emitting layer 10, and a second film comprising silicon nitride may be formed on the first film. The first film may be formed from the silicon nitride, and the second film may be formed from the silicon dioxide. Furthermore, a film comprising the silicon dioxide or silicon nitride may be further formed as a third film on the second film, and a fourth film comprising a material having a refractive index which is different from that of the third film may be formed on the third film.

The insulating film 150 is provided on only a predetermined region of the other face of the light emitting layer 10, the side surfaces of the light emitting layer 10, and peripheral region 104B, shown in FIG. 1B, and is not formed on the side surfaces of the p-type contact layer 104 and the side surfaces of the supporting substrate 20. More concretely, the insulating film 150 is not formed on the side surfaces of the supporting substrate 20, namely a region having substantially the same width as that of the supporting substrate 20. Namely, in the present embodiment, the insulating film 150 is not provided on the side surfaces of the p-type contact layer 104, the side surfaces of the dielectric layer 130, the side surfaces of the reflecting layer 120, the side surfaces of the adhesion layer 200, the side surfaces of the supporting substrate 20, and the side surfaces of the back surface electrode 210.

(Reflecting Layer 120)

The reflecting layer 120 comprises a conductive material having a high reflectivity with respect to the light emitted from the active layer 100. As an example, the reflecting layer 120 comprises a conductive material having a reflectivity of 80% or more with respect to the light emitted from the active layer 100. The reflecting layer 120 reflects the light that is emitted from the active layer 100 and reached the reflecting layer 120 toward the active layer 100. For example, the reflecting layer 120 comprises a metallic material such as Al, Au, and Ag, or alternatively an alloy including at least one selected from these metallic materials. As an example, the reflecting layer 120 may comprise Al with a predetermined film thickness.

The reflecting layer 120 may further comprise a barrier layer comprising a metallic material such as Ti and Pt, and a bonding film which can be easily bonded to the adhesion layer 200. As an example, the barrier layer may comprise Ti with a predetermined film thickness. The barrier layer suppresses the material composing the bonding film from propagating (dispersing) into the reflecting layer 120. The bonding film may comprise a material which is electrically and mechanically bonded to the adhesion layer 200. As an example, the bonding film may comprise Au with a predetermined film thickness.

(Supporting Substrate 20, Adhesion Layer 200, and a Back Surface Electrode 210)

The supporting substrate 20 comprises an electrically conductive material. For example, the supporting substrate 20 may comprise a semiconductor substrate such as p-type or n-type conductive Si substrate, Ge substrate, GaAs substrate, and GaP substrate. The supporting substrate may comprise a metal substrate comprising a metallic material such as Cu. For example, in the present embodiment, a conductive Si substrate is used. The adhesion layer 200 may be formed from Au with a predetermined thickness on a surface of the supporting substrate 20 on an opposite side with respect to a surface where the back surface electrode 210 is formed.

The adhesion layer 200 may further comprise an ohmic contact electrode layer which is in ohmic-contact with the supporting substrate 20, a barrier layer comprising a metallic material such as Ti and Pt, and a bonding film which can be easily bonded to the adhesion layer 200. As an example, the ohmic contact electrode may comprise a metallic material including Au, Ti, Al or the like, and the barrier layer may comprise Pt with a predetermined film thickness. For example, the ohmic contact electrode may be formed from Ti with a predetermined film thickness. The barrier layer suppresses the material composing the bonding film from propagating (dispersing) into the ohmic contact electrode. The bonding film may comprise a material which is electrically and mechanically bonded to the adhesion layer 200. As an example, the bonding film may comprise Au with a predetermined film thickness as described above.

The back surface electrode 210 comprises a material that is electrically connected to the supporting substrate 20. For example, the back surface electrode 210 may comprise a metallic material such as Ti, Au. In the present embodiment, the back surface electrode 210 comprises Ti and Au. More concretely, Ti with a predetermined film thickness is provided to be electrically coupled to the supporting substrate 20 and Au with a predetermined film thickness is further provided on Ti. In addition, the light emitting device 1 is mounted at a predetermined position of a stem comprising a metallic material such as Al and Cu, by using a conductive bonding material such as Ag pates, or a eutectic material such as AuSn, in the state that a side of the back surface electrode 210 is located downwardly.

(Surface Electrode 110 and Pad Electrode 112)

Referring to FIG. 1A, the surface electrode 110 is provided on the n-type contact layer 108 formed on a predetermined region on the n-type cladding layer 106. As understood from FIG. 1A, the surface electrode 110 is formed to have a substantially rectangular shape which comprises curved portions each of which has a predetermined curvature at four corners in the top plan view of the light emitting device 1, as an example. In addition, shape of the surface electrode 110 is not limited to such shape, and the surface electrode 110 may have a circular, shape, polygonal shape (e.g. hexagonal shape) in the top plan view. The pad electrode 112 is formed to be in contact with a surface of the surface electrode 110. The surface electrode 110 comprises a metallic material which is in ohmic contact with the n-type contact layer 108. For example, the surface electrode 110 may comprise a metallic material such as Au, Ge, and Ni. In addition, the pad electrode 112 may comprise a metallic material such as Ti, Au.

The ohmic contact portion 135 is formed in a part of a region except a region right under the surface electrode, when viewed from the other surface (the light extracting surface) side of the light emitting layer 10 toward the active layer 100. The ohmic contact portion 135 is provided within the opening 130a located in a part except a region of the dielectric layer 130 right under the surface electrode 100 in the top plan view. Namely, the surface electrode 110 and the pad electrode 112 are arranged such that the surface electrode 110 and the pad electrode 112 do not superpose the ohmic contact portion 135 in the top plan view.

Figure 1D:
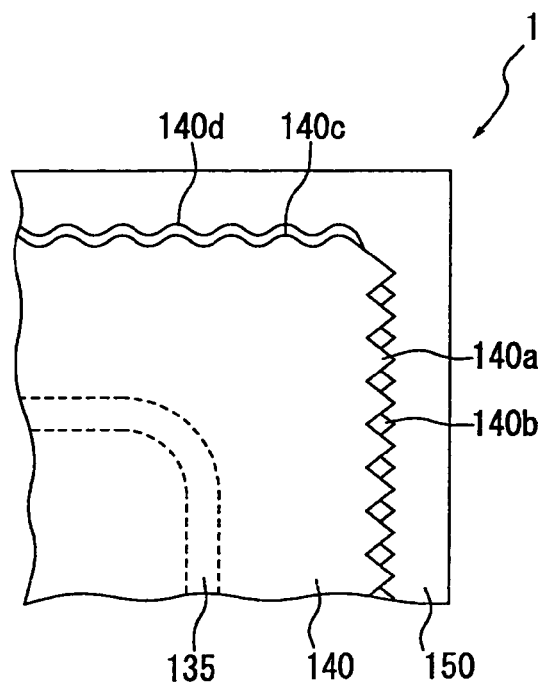
FIG. 1D is an enlarged view of a part of a corner of the light emitting device in the embodiment according to the invention.
Figure 1E:
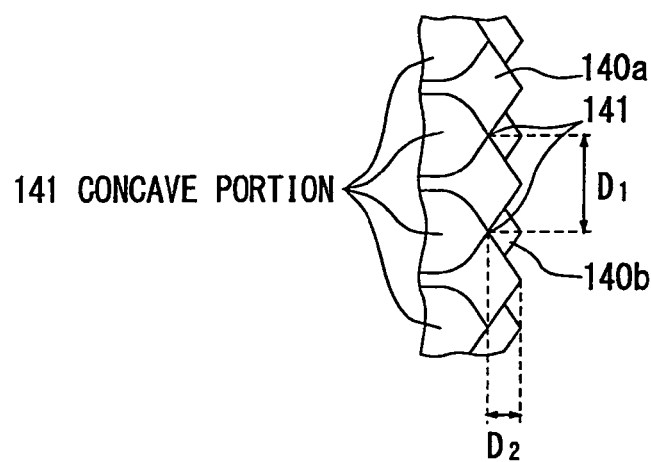
FIG. 1E is an enlarged view of a part of FIG. 1D.
Figure 1F:
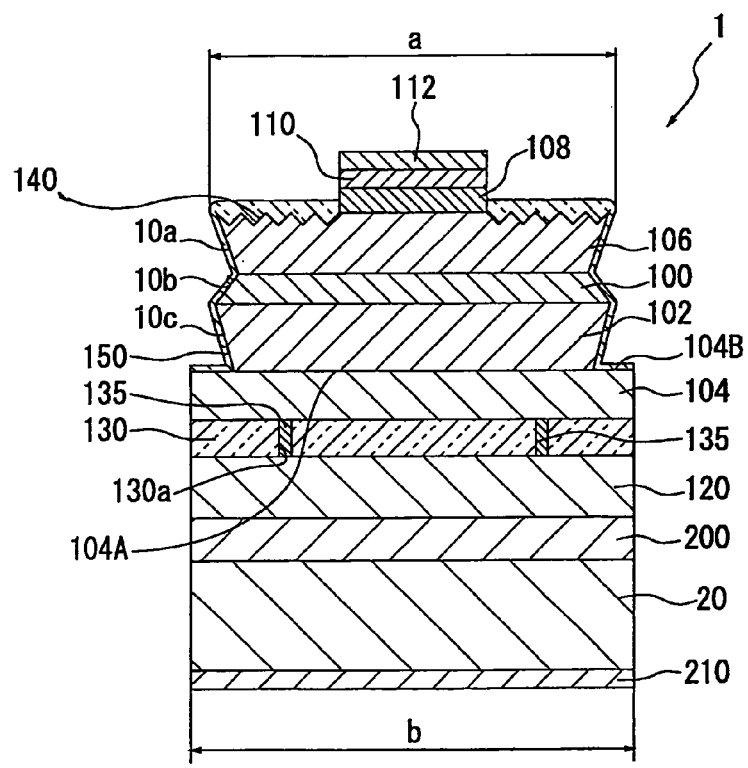
FIG. 1F is an explanatory diagram showing a comparison between a width of a light emitting layer and a width of a supporting substrate.

FIG. 1D is an enlarged top plan view of a part of a corner of the light emitting device in the embodiment according to the invention. FIG. 1E is an enlarged top plan view of a part of FIG. 1D. FIG. 1F is an explanatory diagram showing a comparison between a width of a light emitting layer and a width of a supporting substrate in cross sections of the light emitting device in the embodiment according to the invention.

Referring to FIG. 10, the light emitting device 1 in the present embodiment comprises convexo-concave portions 140a and convexo-concave portions 140b on the side surfaces of the light emitting layer 10. The convexo-concave portion 140a is formed in a reverse mesa structure part 10a, and the convexo-concave portion 140b is formed in a mesa structure part 10b. In other words, the side surface of the light emitting layer 10, which has the reverse mesa structure, comprises a plurality of convexo-concave portions 140a and convexo-concave portions 140b, each of which has an acute angle. On the other hand, a side surface 140c and a side surface 140d, each of which has a curved region, are formed on the side surface of the light emitting layer 10, which is perpendicular to the side surface having the reverse mesa structure, differently from the convexo-concave portion having the acute angle. Herein, FIG. 10 merely shows an outline of the light emitting device 1, and configurations of the side surface 140c and the side surface 140d, each of which has the curved region, are not limited to illustrated configurations.

Referring to FIG. 1E, FIG. 1E is an enlarged view of a part of the side surface of the light emitting layer 10 having the reverse mesa structure. As understood from FIG. 1E, a plurality of the concave portions 141 composing the convexo-concave portion 140 are formed on the surface of the light emitting device 1. In addition, an interval (pitch) $D_1$ between one convex part and another convex part adjacent to the one convex part that are formed on the side surface of the n-type cladding layer 106 and the side surface of the p-type cladding layer 102 is e.g. about 2 μm. In addition, a distance $D_2$ from a tip end of the concave portion 141 of a convex part formed on the side surface of the n-type cladding layer 106 is e.g. about 1 μm. In addition, referring to FIG. 1E, a "width a" on a side of the light emitting layer 10 where the insulating film 150 is formed is provided to be narrower than a "width b" of the supporting substrate 20. Herein, the interval $D_1$ and the distance $D_2$ are not limited to the aforementioned example. The interval $D_1$ and the distance $D_2$ may be appropriately changed in accordance with the application of the light emitting device 1.

(Difference in Light Extraction Efficiency Between Locations for Forming the Convexo-Concave Portion 140)

FIG. 2A shows an outline of a cross section of a light emitting device in a comparative example 1. FIG. 2B shows an outline of a cross section of a light emitting device in a comparative example 2. FIG. 2C is a graph showing a comparison between a relative light extraction efficiency of the light emitting device in the embodiment according to the invention and a relative light extraction efficiency of the light emitting device in the comparative example 2, with respect to a light extraction efficiency of the light emitting device in the comparative example 1 as a reference.

Both of a light emitting device 3 in the comparative example 1 and a light emitting device 4 in the comparative example 2 have structures similar to the structure of the light emitting device 1, except a region where the convexo-concave portions 140 are formed. Therefore, detailed explanations thereof except dissimilarity are omitted here.

In the light emitting device 3 in comparative example 1, a width of a light emitting layer (i.e. a layer including an active layer 100, a p-type cladding layer 102 and an n-type cladding layer 106) is formed to be substantially the same as a width of the supporting substrate 20, and the convexo-concave portions 140 are provided only on a region of the n-type cladding layer 106, except a region where the surface electrode 110 and the pad electrode 112 are provided.

In the light emitting device 4 in comparative example 2, a width of a light emitting layer (i.e. a layer including an active layer 100, a p-type cladding layer 102 and an n-type cladding layer 106) is formed to be slowly reduced along a direction from the p-type contact layer 104 toward the n-type contact layer 108 (i.e. formed to have a mesa shape), and the convexo-concave portions 140 are provided only on a region of the n-type cladding layer 106, except a region where the surface electrode 110 and the pad electrode 112 are provided.

Namely, all of the four side surfaces of the light emitting layer of the light emitting device 4 in the comparative example 2 are consisted of the mesa structures.

Referring to FIG. 2B, when the light extraction efficiency of the light emitting device 3 in the comparative example 1 was "1.0", a relative light extraction efficiency of the light emitting device 4 in the comparative example 2 was "1.05". On the other hand, a relative light extraction efficiency of the light emitting device 1 in the present embodiment according to the present invention was "1.15". Therefore, it is confirmed that a higher light extraction efficiency can be realized by the light emitting device 1 in the present embodiment, compared with the light emitting device 2 in the comparative example 1 and the light emitting device 3 in the comparative example 2.

(Difference in the Light Extraction Efficiency in Accordance with Difference in Thickness of the Insulating Film 150)

Figure 2D:
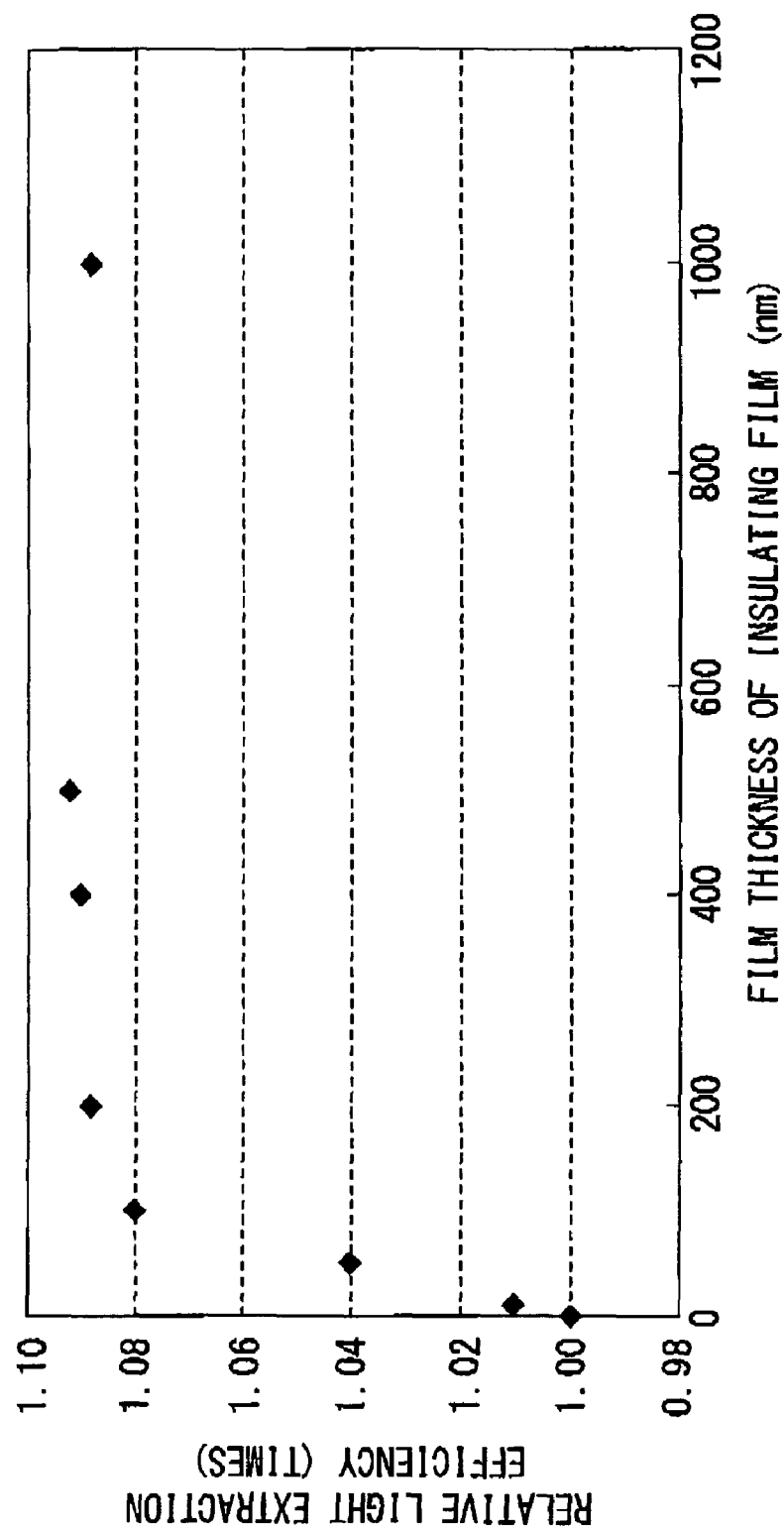
FIG. 2D is a graph showing a difference in the light extraction efficiency in accordance with difference in film thickness of an insulating film of the light emitting device in the embodiment according to the invention.

FIG. 2D is a graph showing a difference in the light extraction efficiency in accordance with difference in thickness of an insulating film of the light emitting device in the embodiment according to the invention.

More concretely, FIG. 2D shows a result of comparing the light extraction efficiency of the light emitting device 1 comprising the insulating film 150 in the present embodiment, by changing a thickness of the insulating film 150 variously, with respect to the light extraction efficiency of the light emitting device 1, from which only the insulating film 150 is removed (i.e. a film thickness of the insulating film is 0 nm) in the present embodiment as a reference. As understood from FIG. 2D, when the film thickness of the insulating film 150 is 100 nm or more, the relative light extraction efficiency of the light emitting device 1 is increased by 1.08 times or more. At least, it is confirmed that the relative light extraction efficiency of the light emitting device 1 in the present embodiment exceeds 1.08 times when the film thickness of insulating film 150 is 200 nm or more and 1000 nm or less (i.e. 200 nm to 1000 nm).

(Percentage of Usable Number of Times of Respective Device-Fixing Jigs and Misalignment Occurrence Percentage)

Figure 2E:
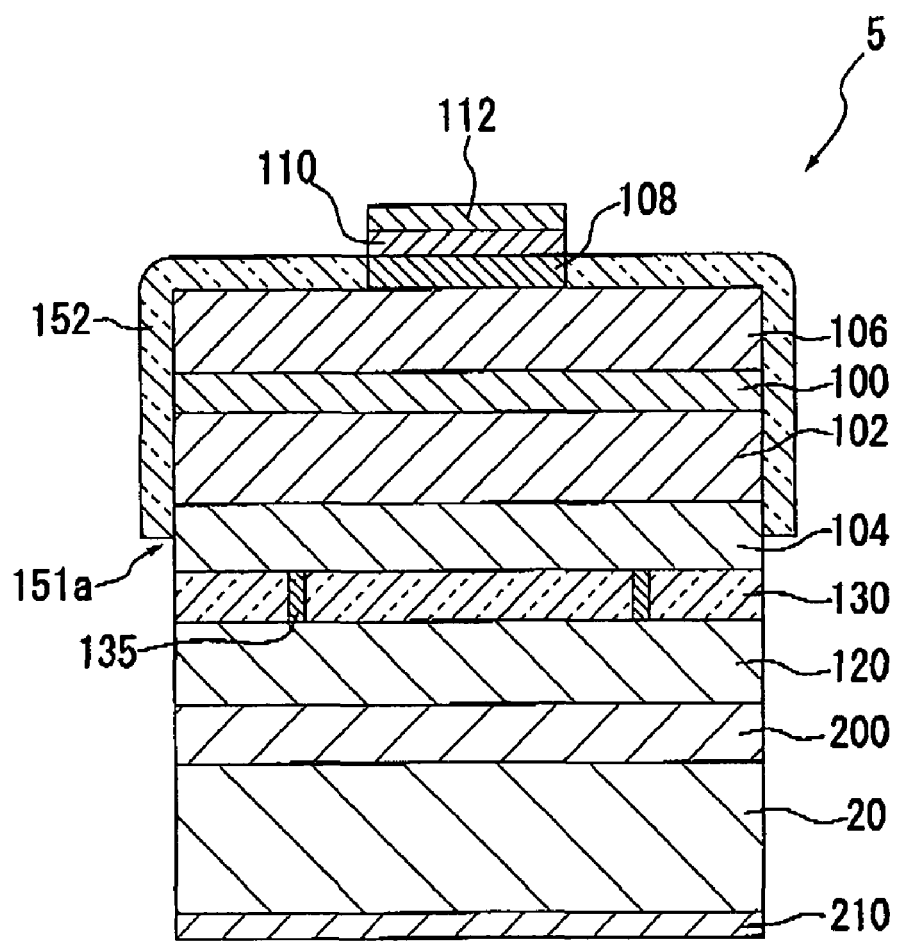
FIG. 2E is a cross sectional view of a light emitting device, in a comparative example 3.
Figure 2G:
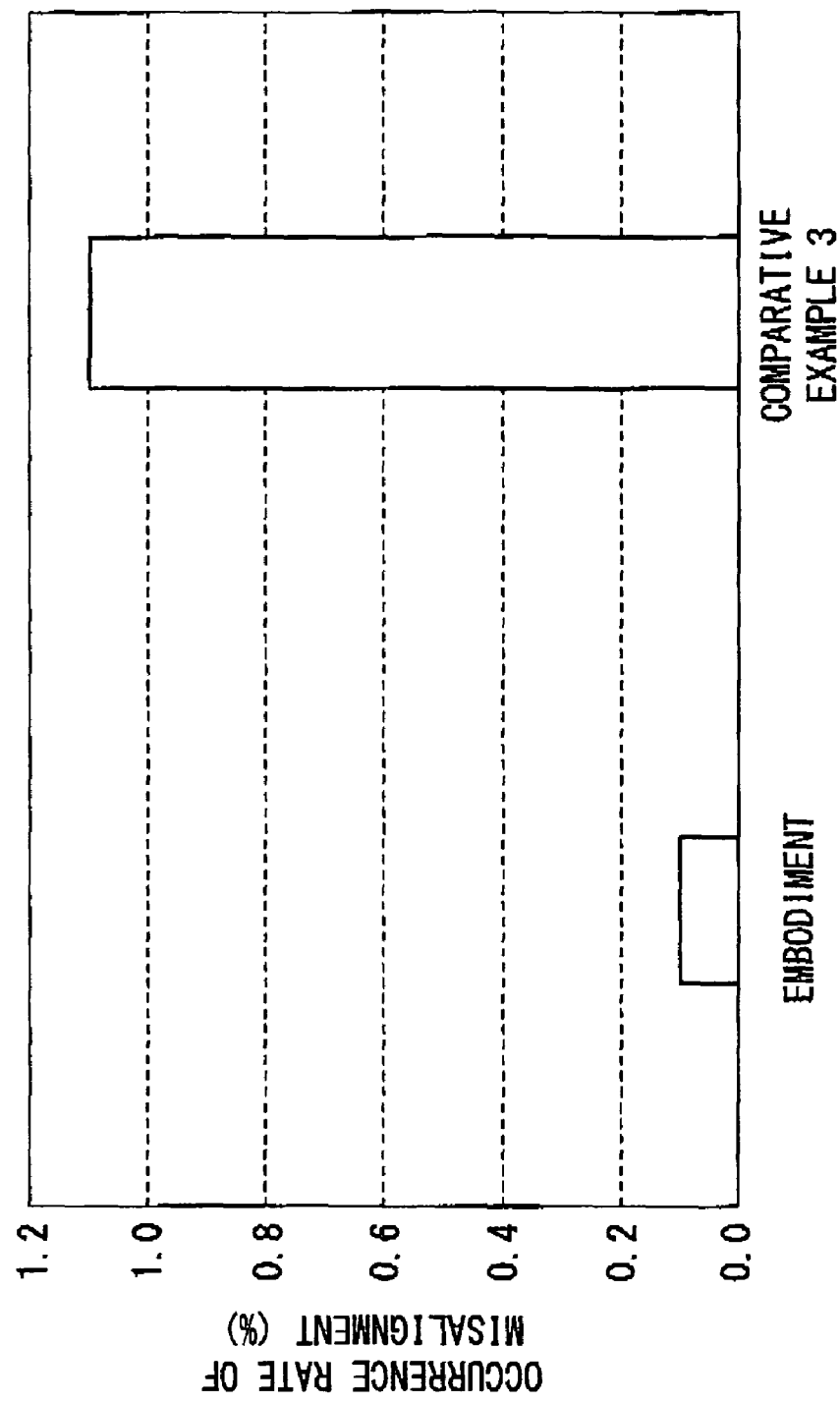
FIG. 2G is a graph showing misalignment occurrence percentage for the light emitting device in the embodiment according to the present invention and the light emitting device in the comparative example 3.

FIG. 2E shows an outline of a cross section of a light emitting device in a comparative example 3. FIG. 2F is a graph showing usable number of times of respective device-fixing jigs for the light emitting device in the embodiment according to the present invention and the light emitting device in the comparative example 3. FIG. 2G is a graph showing misalignment occurrence percentage for, the light emitting device in the embodiment according to the present invention and the light emitting device in the comparative example 3.

A light emitting device 5 in comparative example 3 has a structure similar to that of the light emitting device 1 in the present embodiment, except a width of a light emitting layer (i.e. a layer including an active layer 100, a p-type cladding layer 102 and an n-type cladding layer 106) is formed to be substantially the same as a width of the supporting substrate 20, the convexo-concave portion 140 is not formed, and a step portion (level difference) 151a is formed by forming an insulating film 152 on a part of side surfaces of the light emitting device 5.

For carrying out a test for confirming electrical characteristics of the light emitting device, the light emitting device is pinched by a metal jig to be fixed. The metal jig is worn slowly by repeatedly contacting the side surfaces of the light emitting device. For this case, when the insulating film 152 is formed on the side surfaces of the light emitting device 5 as in the comparative example 3, the jig and the insulating film 152 having a high hardness is in contact with each other, so that abrasion of a surface of the jig is easily advanced. Herein, a material of the jig is a cemented carbide, more concretely, an alloy obtained by sintering a mixture of tungsten carbide and cobalt.

The jig was repeatedly made contact with the side surface of the light emitting device, and the number of contacts of the jig until a replacement of the jig is required was counted. As a result, it is shown in FIG. 2F that a replacement period is shortened in the case where the jig and the insulating film 152 are in contact with each other, such as the light emitting device 5 in the comparative example 3. On the other hand, it is shown in FIG. 2F that it is not necessary to replace the jig until the jig contacts for 10×10 k times, since the insulating film 150 is not formed on a part which contacts the jig in the light emitting device 1 in the present embodiment.

Further, in the case where the width of the device is substantially the same from a top surface to a bottom surface (through an entire height), and the insulating film 152 is formed on only a part of the side surfaces of the device, such as the light emitting device 5 in the comparative example 3, a significant step portion (level difference) 151a is formed on the side surfaces of the device. Herein, for shipping the light emitting devices, it is necessary to inspect chip characteristics before the shipping, and to sort only non-defective units. The chip characteristics are checked with a chip prober. Herein, it is necessary to transfer the light emitting device by picking it up by the jig for mounting the light emitting device on the chip prober. For this case, since the light emitting device 5 comprises the step portion (level difference) 152a, there is a high possibility that the light emitting device 5 is inclined when the light emitting device 5 in the comparative example 3 is picked up by the jig. As a result, misalignment of the light emitting device 5 (i.e. misalignment in a non-defective unit group after judging and screening the non-defective units) occurs.

Accordingly, the percentage of misalignment was compared between the light emitting device 1 in the present embodiment and the light emitting device 5 in the comparative example 3. As a result, the percentage of misalignment of the light emitting device 5 in the comparative example 3 was 1.1%, and the percentage of misalignment of the light emitting device 1 in the present embodiment was 0.1%. Therefore, it is shown that the percentage of misalignment was extremely small in the present embodiment.

(Variations)

The light emitting device 1 in the embodiment emits the light including red at a wavelength of 624 nm. However, the wavelength of the light emitted from the light emitting device 1 is not limited to this wavelength. Further, it is possible to form the light emitting device 1, which emits a light in a predetermined wavelength range by controlling the structure of the active layer 100 of the light emitting layer 10. The active layer 100 emits the light within the wavelength range of e.g. orange light, yellow light, and green light. The light emitting layer 10 of the light emitting device 1 may comprise InAlGaN-based compound semiconductor including the active layer 100 which emits the light within the wavelength range of e.g. ultraviolet, violet, and blue.

Further, in the light emitting layer 10, a conductivity type of the compound semiconductor layer composing each of the light emitting layer 10, p-type contact layer 104 and the n-type contact layer 108 or the like may be changed to a conductivity type opposite to the conductivity type in this embodiment. For example, the conductivity type of the n-type contact layer 108 and the n-type cladding layer 106 may be changed to p-type, and the conductivity type of the p-type cladding layer 102 and the p-type contact layer 104 may be changed to n-type.

Further, the active layer 100 may comprise a quantum well structure. The quantum well structure may comprise a single quantum well structure, a multiquantum well structure or a strain multiquantum well structure.

Still further, the ohmic contact portion 135 in the present embodiment has a single and continued configuration. However, the ohmic contact portion 135 may be formed to have a configuration which is divided into plural parts.

(Process for Fabricating the Light Emitting Device 1)

FIGS. 3A to 3M are diagrams showing an example of a process for fabricating the light emitting device in the present embodiment.

Figure 3A:
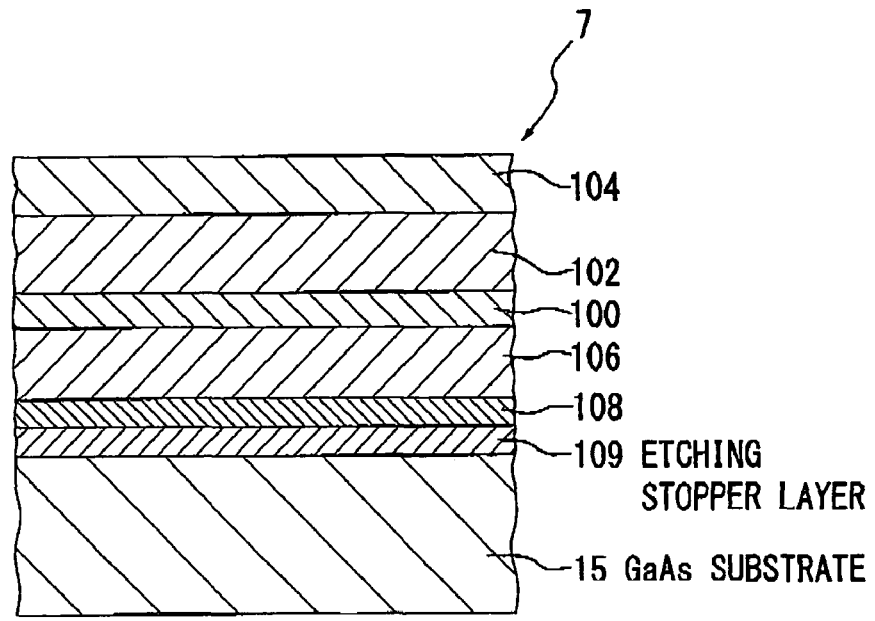
FIG. 3A is a diagram showing a manufacturing process of the light emitting device in the embodiment according to the invention.

At first, as shown in FIG. 3A, an AlGaInP based semiconductor multilayer structure including plural compound semiconductor layers is grown by Metal Organic Vapor Phase Epitaxy (MOVPE) on an n-type GaAs substrate 15, for example. More concretely, the etching stopper layer 109 comprising an undoped $(Al_{0.7}Ga_{0.3})_{0.5}In_{0.5}P$, an n-type contact layer 108 comprising a Si-doped n-type GaAs, the n-type cladding layer 106 comprising a Si-doped n-type $(Al_{0.7}Ga_{0.3})_{0.5}In_{0.5}P$, the active layer 100 comprising an undoped $(Al_{0.1}Ga_{0.9})_{0.5}In_{0.5}P$, and the p-type cladding layer 102 comprising a Mg-doped p-type $(Al_{0.7}Ga_{0.3})_{0.5}In_{0.5}P$, and the p-type contact layer 104 comprising a Mg-doped p-type GaP are grown in this order on the n-type GaAs substrate 15, to provide an epitaxial wafer 7 in which the semiconductor multilayer structure including the light emitting layer 10 is formed on the n-type GaAs substrate 15.

Here, the formation of the semiconductor multilayer structure by using the MOVPE method is carried out by setting a growth temperature at 650 degrees C., a growth pressure at 6666.1 Pa (50 Torr), the respective growth speeds of a plurality of the compound semiconductors included in the semiconductor multilayer structure at 0.3 nm/sec to 1.0 nm/sec, and a V/III ratio to almost 200. Further, the V/III ratio means a ratio of molar ratio of V group materials such as arsine ($AsH_3$), phosphine ($PH_3$) to molar ratio of III group materials such as trimethylgallium (TMGa), trimethylaluminum (TMAl).

As sources used in the MOVPE method, an organometallic compound such as trimethylgallium (TMGa), triethylgallium (TEGa), trimethylaluminum (TMAl), and trimethylindium (TMIn), and a hydride gas such as arsin ($AsH_3$) and phosphine ($PH_3$) may be used. Further, as a source of the n-type dopant, disilane ($Si_2H_6$) may be used. As a source of the p-type dopant, biscyclopentadienyl magnesium ($Cp_2Mg$) may be used.

Further, as the source of the n-type dopant, hydrogen selenide ($H_2Se$), monosilane ($SiH_4$), diethyl tellurium (DETe) or dimethyl tellurium (DMTe) may be used. As the source of the p-type dopant, dimethylzinc (DMZn) or diethylzinc (DEZn) may be used.

Figure 3B:
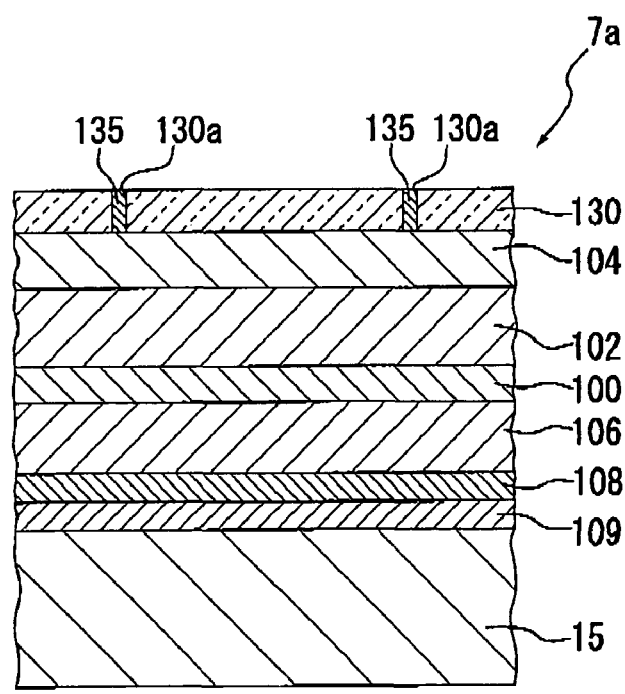
FIG. 3B is a diagram showing the manufacturing process of the light emitting device in the embodiment according to the invention.
Figure 3C:
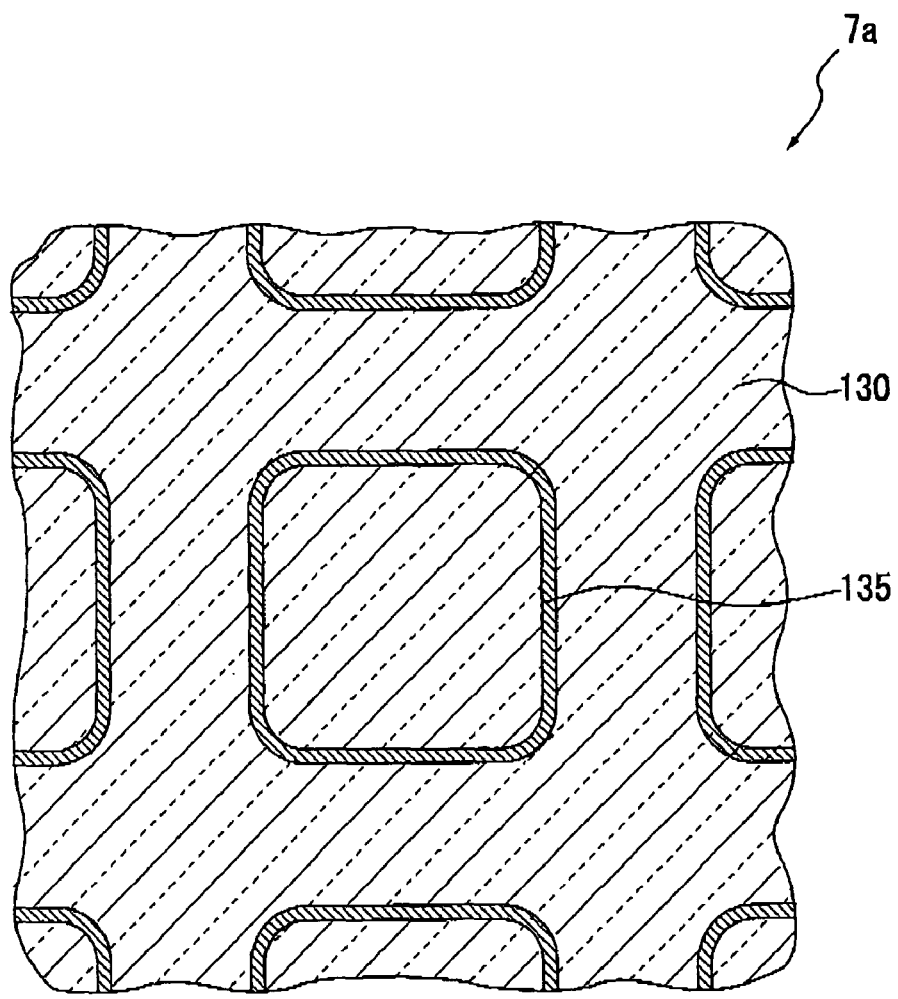
FIG. 3C is a diagram showing the manufacturing process of the light emitting device in the embodiment according to the invention.

Next, as shown in FIG. 3B, after taking out the epitaxial wafer 7 formed as shown in FIG. 3A from the MOVPE equipment, a dielectric layer 130 is formed on the surface of p-type contact layer 104. More concretely, a $SiO_2$ film as the dielectric layer 130 is formed on the surface of the p-type contact layer 104 by plasma Chemical Vapor Deposition (CVD) equipment. In the case where the dielectric layer 130 comprises plural layers, the dielectric layer 130 may be formed by vacuum deposition method, sputtering method or the like.

Next, openings 130a are formed at the dielectric layer 130 by using photolithography method and etching method. For example, a photoresist pattern having a groove at a region corresponding to the opening 130a is formed on the dielectric layer 130. The openings 130a are formed to penetrate through the dielectric layer 130 from a surface of the dielectric layer 130 until an interface between the p-type contact layer 104 and the dielectric layer 130. More concretely, the openings 130a are formed at the dielectric layer 130 by removing regions where the photoresist pattern is not formed of the dielectric layer 130 with use of a fluorinated acid based etchant as etchant. The openings 130a are formed at regions where the ohmic contact portions 135 will be provided as explained in FIGS. 1A and 1B.

Subsequently, a AuZn alloy which is a material composing the ohmic contact portion 135 is formed within the opening 130a by using the vacuum deposition method. For example, AuZn is vacuum-evaporated within the opening 130a by using the photoresist pattern for forming the opening 130a as a mask, to provide the ohmic contact portion 135. As an example, referring to FIG. 3C, the ohmic contact portion 135 is formed in a predetermined region in the dielectric layer 130 and except a region where the surface electrode 110 and the pad electrode 112 should be formed.

According to this step, as shown in FIG. 3B, an ohmic contact portion-provided epitaxial wafer 7a which has the ohmic contact portion 135 comprising AuZn in the dielectric layer 130 is formed. Herein, the ohmic contact portion 135 function as ohmic electrode after alloying process is carried out as described later.

Figure 3D:
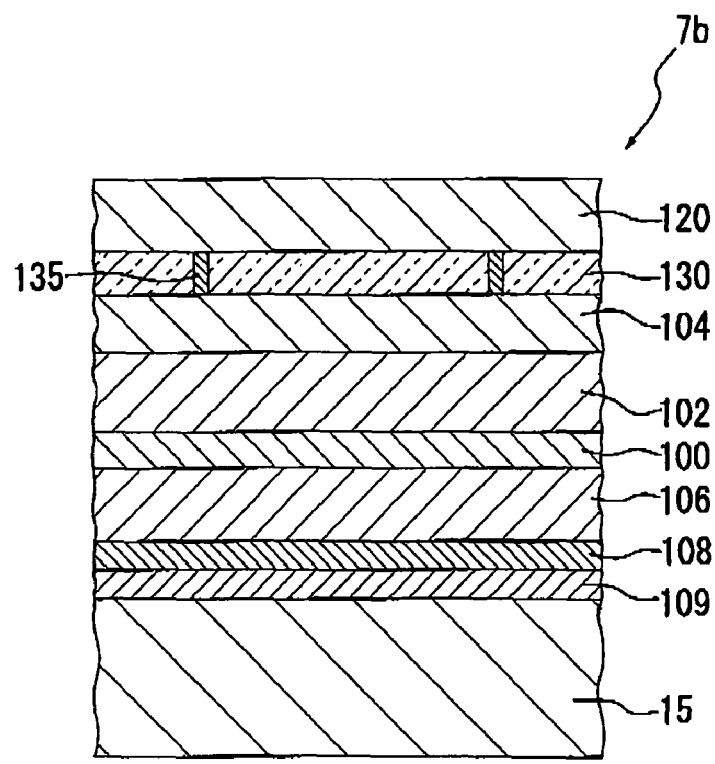
FIG. 3D is a diagram showing the manufacturing process of the light emitting device in the embodiment according to the invention.

Next, as shown in FIG. 3D, a reflecting layer 120 as a metallic reflecting layer is formed on a surface of the ohmic contact portion-provided epitaxial wafer 7a, namely on a surface of the dielectric layer 130 and the ohmic contact portion 135. More concretely, an Al layer as the reflecting layer 120 is formed by using the vacuum deposition method or sputtering method. Preferably, a Ti layer as a barrier layer and a Au layer as an adhesion layer may be formed in this order on the reflecting layer 120. According to this process, a reflecting layer-provided epitaxial wafer 7b is formed. Herein, as the reflecting layer 120, a material having a high reflectivity with respect to the wavelength of the light emitted from the active layer 100 may be selected.

Figure 3E:
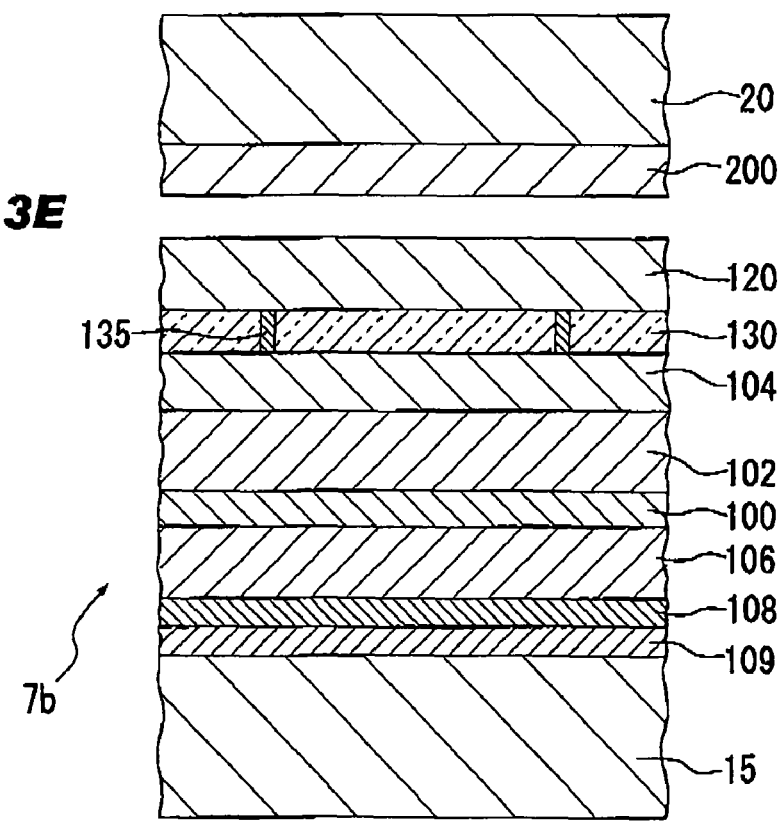
FIG. 3E is a diagram showing the manufacturing process of the light emitting device in the embodiment according to the invention.

Next, as shown in FIG. 3E, a conductive Si substrate as a supporting substrate 20, on a surface of which an adhesion layer 200 is formed, is prepared. In the case where the adhesion layer 200 is formed to include an ohmic contact electrode layer, a barrier layer, and a bonding film, Ti as the ohmic contact electrode layer, Pt as the bather layer, and Au as the bonding film are formed in this order on the Si substrate as the supporting substrate 20 by using the vapor deposition method. Successively, a surface of the reflecting layer 120 of the reflecting layer-provided epitaxial wafer 7b and a surface of the adhesion layer 200 of the supporting substrate 20 are stuck to be facing to each other, and held in this state by a jig made from carbon or the like. In the case where the reflecting layer 120 includes the bonding film and the adhesion layer includes the other bonding film, the bonding film of the reflecting layer 120 and the bonding film of the adhesion layer 200 are overlapped with each other.

Successively, a jig holding the state that the reflecting layer-provided epitaxial wafer 7b is stuck on the supporting substrate 20 is introduced in a wafer bonding equipment. Then, the wafer bonding equipment is depressurized to a predetermined pressure. As an example, the predetermined pressure is set as 1.333 Pa (0.01 Torr). Then, a pressure is applied through the jig to the reflecting layer-provided epitaxial wafer 7b and the supporting substrate 20 overlapped with each other. As an example, a pressure of 30 kgf/cm² is applied. Next, the jig is heated to a predetermined temperature with a predetermined rate of temperature elevation.

More concretely, the temperature of the jig is raised to 350° C. After the temperature of the jig reached to 350° C., the jig is held at the temperature of 350° C. for about 30 minutes. Then, the jig is gradually cooled and the temperature of the jig is decreased enough, for example, to the room temperature. After the temperature of the jig fell, the pressure applied to the jig is left open. After the pressure in the wafer bonding equipment is increased to an atmospheric pressure, the jig is taken out from the equipment. According to this process, the reflecting layer-provided epitaxial wafer 7b having the reflecting layer 120 and the supporting substrate 20 having the adhesion layer 200 are mechanically bonded and electrically coupled with each other between the reflecting layer 120 and the adhesion layer 200.

Next, a bonded structure, in which the reflecting layer-provided epitaxial wafer 7b having the reflecting layer 120 and the supporting substrate 20 having the adhesion layer 200 are bonded, is stuck by an attaching wax on a jig of a lapping equipment. More concretely, a surface on a side of the supporting substrate 20 is attached to the jig. Then, the n-type GaAs substrate 15 of the bonded structure is lapped to have a predetermined thickness. Subsequently, the bonded structure after lapping is detached from the jig of the lapping equipment, and the wax bonded to the surface of the supporting substrate 20 is removed by cleaning. Thereafter, the n-type GaAs substrate 15 is selectively and sufficiently removed from the bonded structure after lapping by selective etching using an etchant for GaAs etching, to form a bonded structure in which an etching stopper layer 109 is exposed. As the etchant for GaAs etching, a mixture of ammonia water and hydrogen peroxide water may be used. In addition, the n-type GaAs substrate 15 may be completely removed by selective etching without lapping the n-type GaAs substrate 15.

Figure 3F:
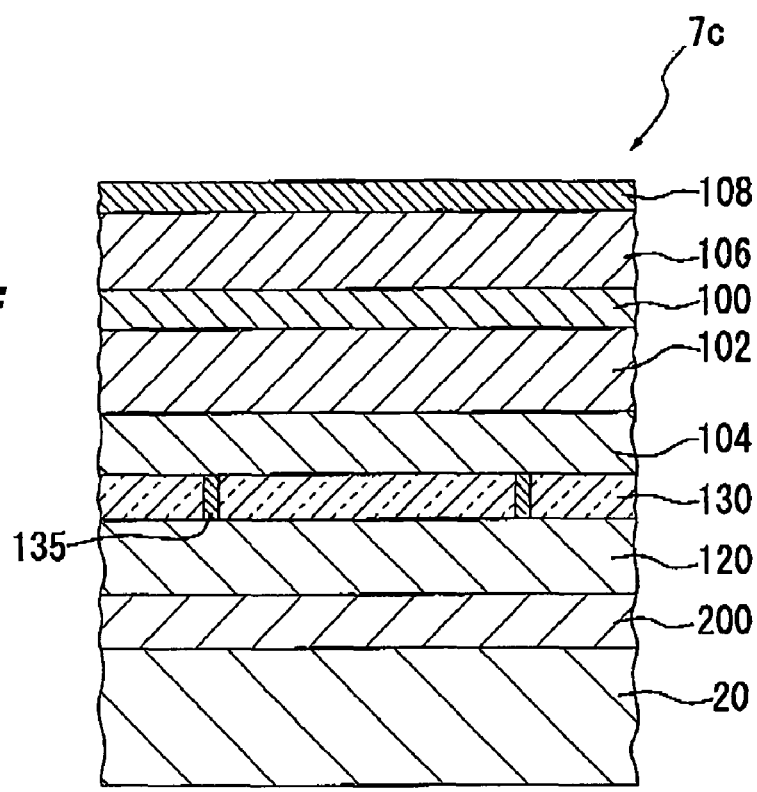
FIG. 3F is a diagram showing the manufacturing process of the light emitting device in the embodiment according to the invention.

Subsequently, the etching stopper layer 109 is removed from the bonded structure, in which the GaAs substrate 15 is removed, by etching with use of a predetermined etchant to provide a bonded structure 7c in which the etching stopper layer 109 is removed, as shown in FIG. 3F. When the etching stopper layer 109 comprises an AlGaInP based compound semiconductor, an etchant including hydrochloric acid may be used as the predetermined etchant. According to this step, a surface of the n-type contact layer 108 is exposed to the outside.

Successively, the surface electrode 110 is formed at a predetermined position on the surface of the n-type contact layer 108 by the photo lithography method and the vacuum deposition. The surface electrode 110 is formed to have a substantially square shape provided with respective curved portions at its four corners, and a length of each side is 105 μm. The surface electrode 110 may be formed, for example, by depositing AuGe, Ti, and Au on the n-type contact layer 108 in this order. For this case, the surface electrode 110 is formed not to be located right above the ohmic contact portion 135 as shown in FIG. 3H.

Figure 3G:
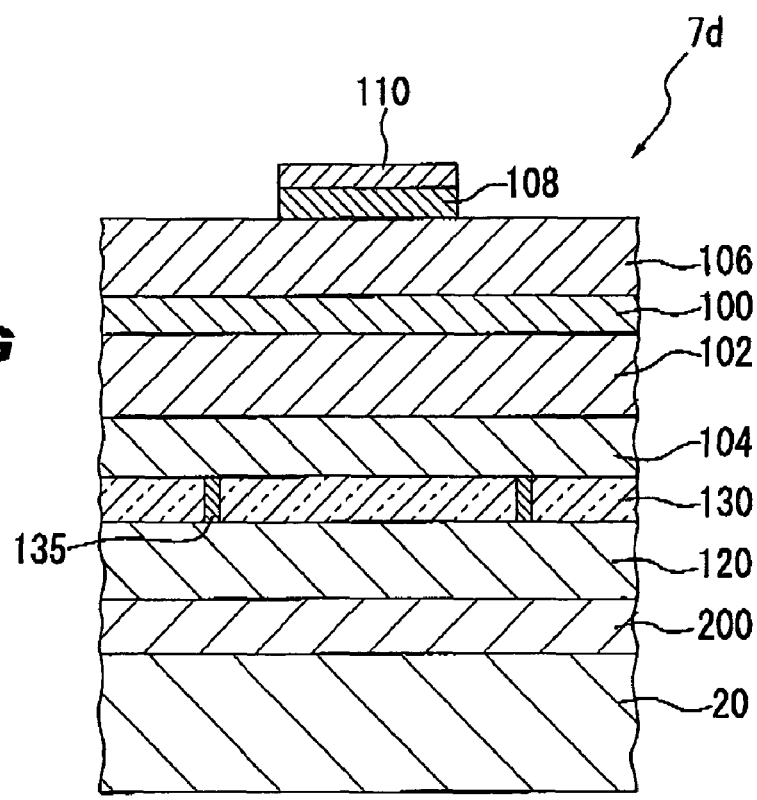
FIG. 3G is a diagram showing the manufacturing process of the light emitting device in the embodiment according to the invention.
Figure 3H:
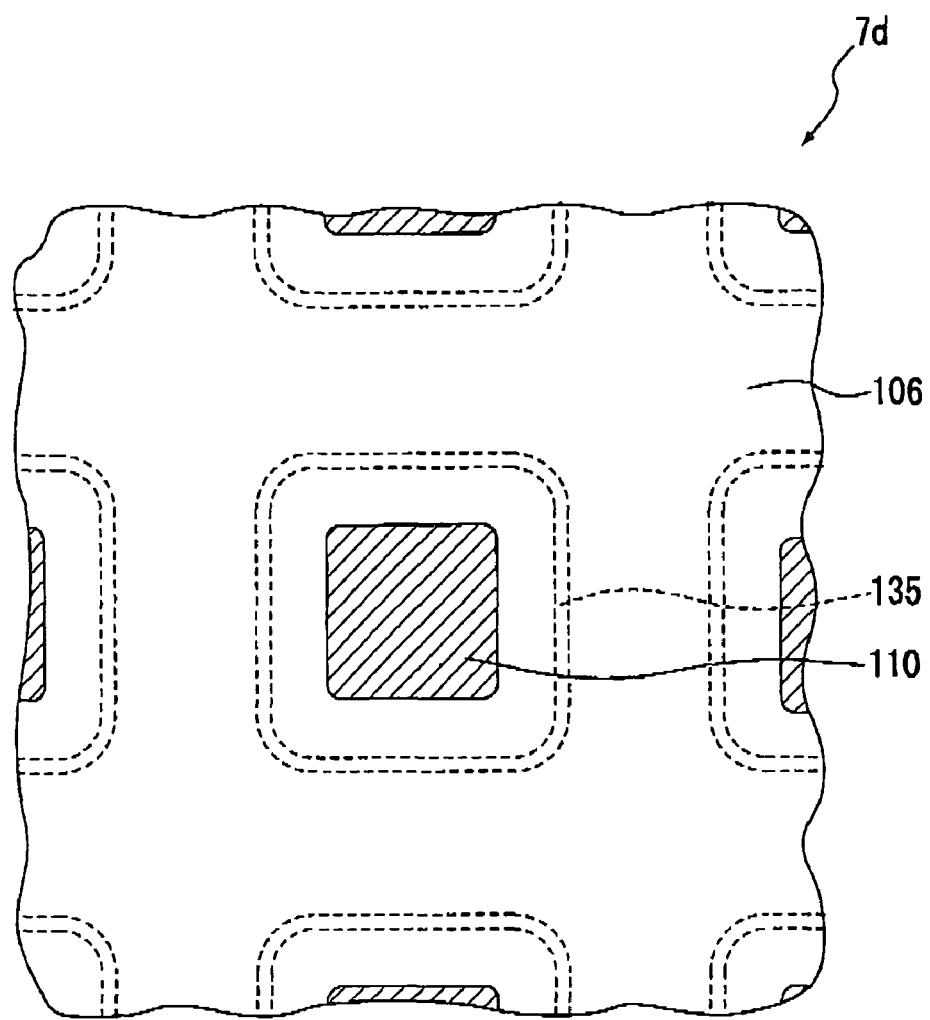
FIG. 3H is a diagram showing the manufacturing process of the light emitting device in the embodiment according to the invention.

Next, the etching treatment using a mixture of sulfuric acid and hydrogen peroxide water is performed on the n-type contact layer 108, except a part of the n-type contact layer 108 provided right under the surface electrode 110, with using the surface electrode 110 as a mask, thereby providing a bonded structure 7d as shown in FIG. 3G. By using the above mixture, it is possible to selectively etch the n-type contact layer 108 comprising GaAs as against the n-type cladding layer 106 comprising the n-type $(Al_{0.7}Ga_{0.3})_{0.5}In_{0.5}P$. Therefore, in the bonded structure 7d, a part of a surface of the n-type cladding layer 106 (i.e. the surface of the n-type cladding layer 106 except a part right under the surface electrode 110) is exposed to the outside.

Figure 3I:
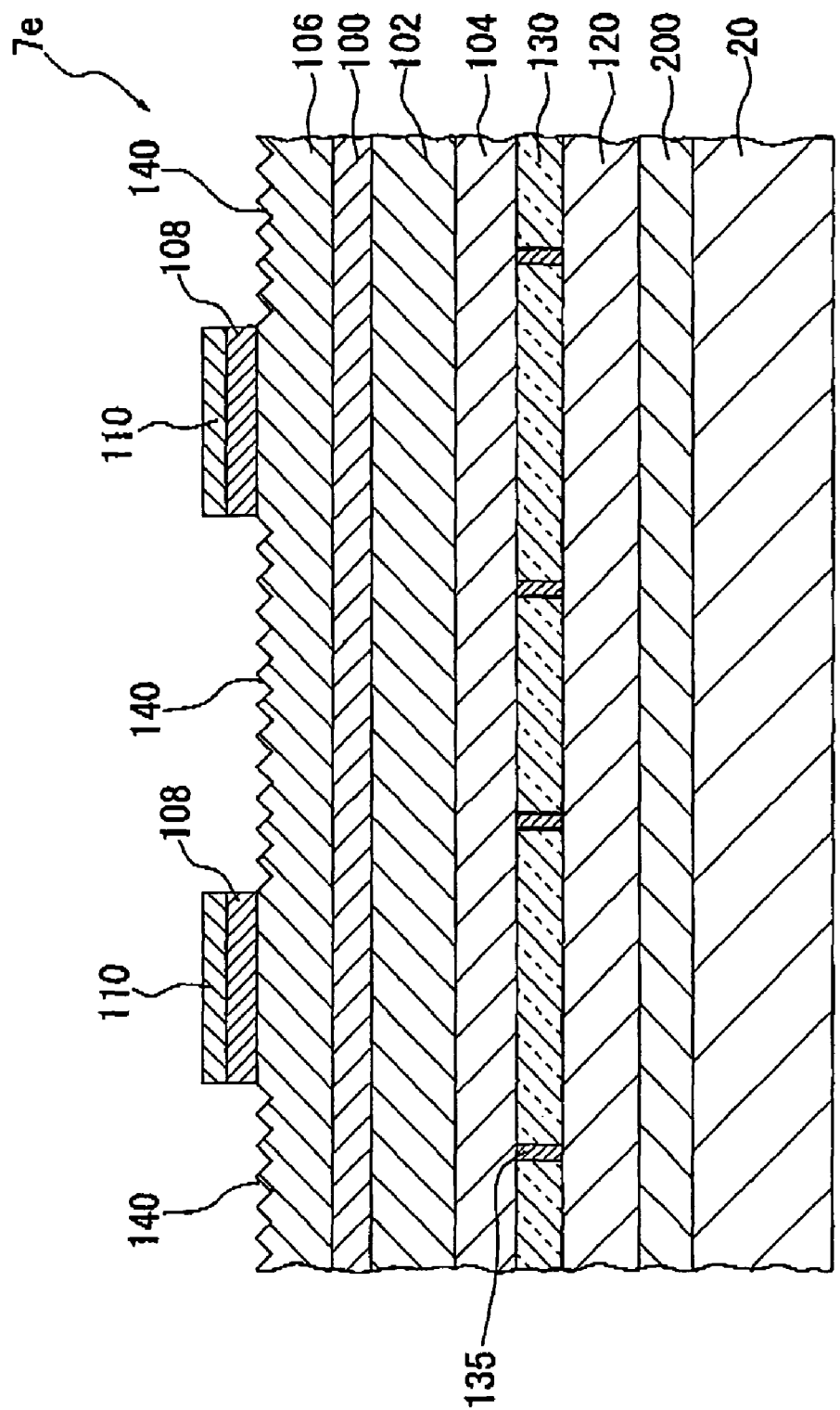
FIG. 3I is a diagram showing the manufacturing process of the light emitting device in the embodiment according to the invention.

Next, as shown in FIG. 3I, a bonded structure 1e is formed by forming the convexo-concave portions 140 on the surface of the n-type cladding layer 106. More concretely, a mask pattern in which concave portions or convex portions are repeatedly provided with a predetermined interval is formed on the surface of the n-type cladding layer 106. For example, a mask pattern in which the concave portions or the convex portions are repeatedly provided at an interval of 2 μm is formed. Herein, a pattern for the concave portions or a pattern for convex portions is formed with a matrix arrangement, honeycomb arrangement or the like. Then, the convexo-concave portions 140 are formed on the surface of the n-type cladding layer 106 by wet etching method with using the mask pattern thus formed as a mask. According to this step, the bonded structure 7e having the convexo-concave portions 140 is provided.

Successively, a mask pattern for separating the light emitting devices from each other is formed on a surface of the bonded structure 7e by photolithography method. In other words, a mask pattern for light emitting device separation is formed on the surface of the n-type cladding layer 106 of the bonded structure 7e. The light emitting devices are separated from each other by removing a part from the surface side of the n-type cladding layer 106 through the p-type contact layer 104 by wet etching method with use of the mask pattern as mask.

In such a case, on the side surfaces of the light emitting layer 10, a reverse mesa structure 10a is formed on each of the side surfaces of the n-type cladding layer 106, and a reverse mesa structure 10c is formed on each of the side surfaces of the p-type cladding layer 102. Furthermore, a mesa structure 10b is formed on each of the side surfaces of the active layer 100, and the convexo-concave portions 140 are formed on the side surfaces of the light emitting layer 10. In FIG. 3J, the convexo-concave portions 140 formed on the side surfaces of the light emitting layer 10 are not shown for the explanation purpose. In addition, for the explanation purposes, a cross section showing the side surface where the mesa structure is formed is not shown (it is similar in explanation of a manufacturing process to be described later). According to this step, a bonded structure 7f in which a plurality of light emitting devices are separated from each other is formed as shown in FIG. 3J. In addition, since the side surfaces of the light emitting layer 10 are exposed by the wet etching, mechanical damage will not be given to the light emitting layer 10 compared with the case where the light emitting devices are mechanically separated from each other.

Next, an insulating film 150 is formed on the surface of the bonded structure 7f by plasma CVD method. As to the insulating film 150, for example, a $SiO_2$ film is formed. Thereafter, a mask pattern is formed on a part except a region right above the surface electrode 110 by the photolithography method. Successively, the insulating film 150 right above the surface electrode 110 is removed by etching with the use of an etchant including hydrofluoric acid and the mask pattern as a mask. According to this step, a bonded structure 7g in which the surface of the surface electrode 110 is exposed as shown in FIG. 3K is formed. Herein, it is preferable that a film thickness of the insulating film 150 is e.g. 400 nm or more, since an etching rate for the aforementioned etching may be varied in accordance with a location of the bonded structure 7f due to unevenness in configuration in the horizontal direction of the bonded structure 7f.

Figure 3L:
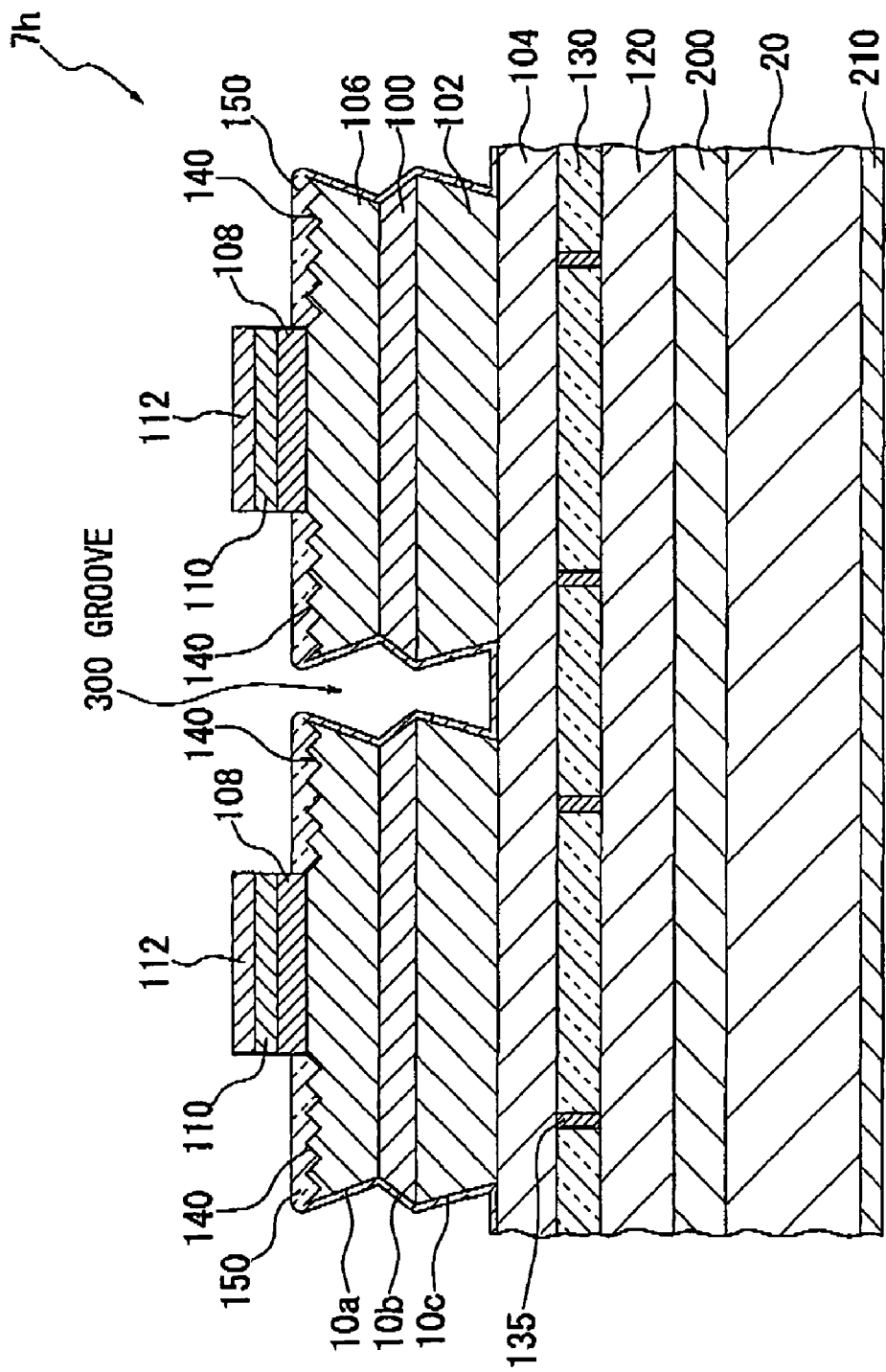
FIG. 3L is a diagram showing the manufacturing process of the light emitting device in the embodiment according to the invention.

Next, a back surface electrode 210 is formed on a back surface of the supporting substrate 20 by vacuum deposition or sputtering method. For example, Ti and Au are formed in this order on the back surface of the supporting substrate 20. After the back surface electrode 210 is formed, a heat treatment in a predetermined atmosphere at a predetermined temperature for a predetermined time (i.e. alloying process for alloying the back surface electrode 210) is performed on the supporting substrate 20 on which the back surface electrode 210 is formed. As an example, the alloying process is carried out at a temperature of 400° C. in a nitrogen atmosphere as an inert atmosphere for five minutes. Successively, a pad electrode 112 is formed on the surface of the surface electrode 110 by the photo lithography method and the vacuum deposition, or the sputtering method. For example, the pad electrode 112 is formed by depositing Ti and Au in this order on the surface of the surface electrode 110. According to this step, a bonded structure 7h is formed as shown in FIG. 3L.

In the present embodiment, when the wafer is device-isolated to separate the light emitting devices 1 from each other by using a dicing equipment to be described later, a dicing blade is inserted into a groove 300 so that the wafer is cut. In this case, for example, the groove 300 is not filled with a material composing the insulating film 150, and the insulating film 150 is merely formed with a thin thickness on the surface of the p-type contact layer 140. Therefore, in the present embodiment, it is possible to suppress an excessive abrasion of the dicing blade, prevent the light emitting layer 10 from generation of unexpected stress, and suppress the generation of cutting waste of the insulating film 150 in dicing the wafer with the dicing equipment.

Figure 3M:
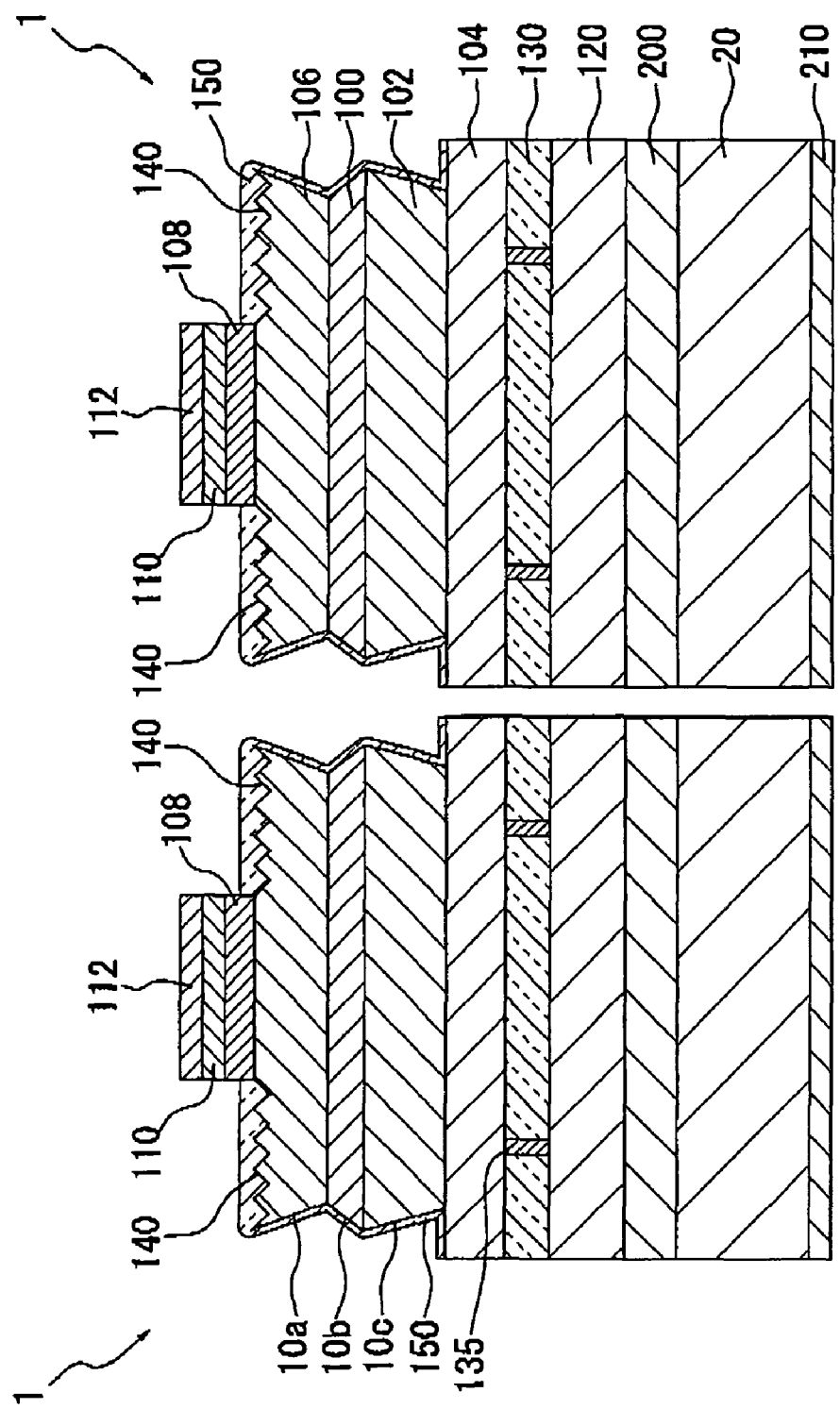
FIG. 3M is a diagram showing the manufacturing process of the light emitting device in the embodiment according to the invention.

Next, the bonded structure 7h in which a surface on the side of the support substrate 20 is stuck on an adhesive sheet is put on the dicing equipment. The device-isolation is carried out by putting the dicing blade rotating with a predetermined revolution speed toward the side of the supporting substrate 20 in the groove 300. According to this step, the light emitting device 1 in the present embodiment as shown in FIG. 3M is fabricated.

The light emitting device 1 fabricated by the process shown in FIG. 3A to FIG. 3M is e.g. a light emitting diode (LED) with a configuration of a substantially rectangular with a device size (plane dimensions) of 200 μm×200 μm. Thereafter, the light emitting device 1 is bonded on a stem such as TO-18 stem by die-bonding with using an electrically conductive material, and the surface electrode 110 and a predetermined region of the TO-18 stem are electrically connected by a wire of Au or the like. Characteristics of the light emitting device 1 can be evaluated by feeding the electric current from outside to the ohmic contact portion 135 via the wire.

Effect of the Embodiment

In the light emitting device 1 in the present embodiment, the convexo-concave portions 140 are formed on a part of the surface of the light emitting layer 10 and the side surfaces of the light emitting layer 10 and the convexo-concave portions 140 are covered with the insulating film 150 as a protective layer. Therefore, a covered region is mechanically protected by the insulating film 150. Accordingly, even if the jig such as collet contact with the light emitting device 1 for mounting the light emitting device 1 on the stem, it is possible to suppress the generation of the mechanical damage in the light emitting layer 10 which is thin in thickness and extremely weak in mechanical strength and the convexo-concave portions 140 that are weak in mechanical strength. Further, since the convexo-concave portions 140 are formed on both of a part of the surface (i.e. the surface of the n-type cladding layer 106) which is the light-extracting surface of the light emitting layer 10 and the side surfaces of the light emitting layer 10, it is possible to enhance the light extraction efficiency of the light emitting device 1.

Further, in the light emitting device 1 in the present embodiment, the convexo-concave portions 140 are covered with the insulating film 150 which is transparent with respect to the light emitted from the active layer 100. Therefore, it is possible to further enhance the light extraction efficiency of the light emitting device 1. In addition, since the insulating film 150 is formed on the side surfaces of the light emitting film 10, it is possible to prevent a short-circuit due to attachment of unnecessary conductive material to the side surfaces of the light emitting layer 10 and oxidation of the light emitting layer 10.

Still further, in the light emitting device 1 in the present embodiment, the width on the sides of the light emitting layer 10 in which the insulating film 150 is formed to be narrower than a width of the support substrate 20. Therefore, even though the light emitting layer 10 is picked up by the jig, the mechanical damage will not be given to the light emitting layer 10. In addition, since the light emitting device is held by the jig in the state where the supporting substrate 20 is pinched by the jig, the insulating film 150 having the high hardness does not contact the surface of the jig. Therefore, it is possible to suppress the abrasion of the surface of the jig, so that the jig can be used for a long term.

First Variation of the Embodiment

Figure 4:
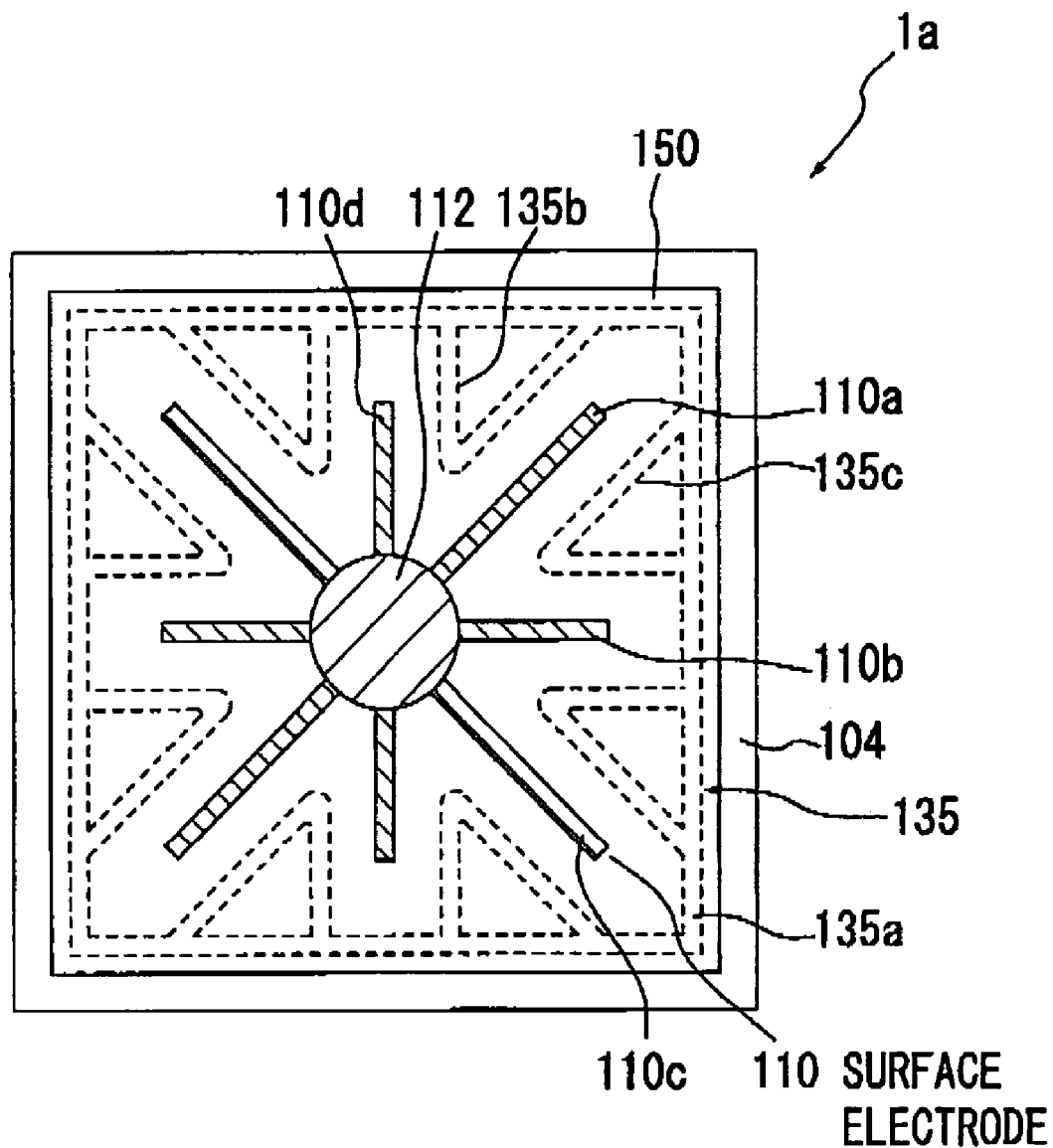
FIG. 4 is a schematic top plan view of a light emitting device in a first variation of the embodiment according to the invention.

FIG. 4 is a schematic top plan view of a light emitting device in a first variation of the embodiment according to the invention.

The light emitting device 1a in the first variation of the embodiment according to the present invention has a configuration substantially similar to that of the light emitting device 1 in the embodiment, except shapes of the surface electrode 110 and the ohmic contact portion. Therefore, detailed explanation thereof is omitted except dissimilarities therebetween.

In the light emitting device 1a in the first variation of the embodiment, the surface electrode 110 comprises a circular electrode provided right under the pad electrode 112 and a plurality of narrow electrodes extending from a center of the circular electrode toward an outer circumference of the light emitting device 1a in its top plan view. In FIG. 4, the circular electrode is not shown, since the circular electrode is located right under the pad electrode 112.

More concretely, the surface electrode 110 comprises a narrow electrode 110a located along a direction of one diagonal line of the light emitting device 1a formed to be substantially square in its top plan view, a narrow electrode 110c located along a direction of another diagonal line, a narrow electrode 110b provided along a direction parallel to one side of the light emitting device 1a and on a part of a line connecting between substantially middle points of two sides that are perpendicular to the one side, and a narrow electrode 110d provided along a direction perpendicular to a longitudinal direction of the narrow electrode 110b. An intersection point between the narrow electrode 110a and the narrow electrode 110c and an intersection point between the narrow electrode 110b and the narrow electrode 110d are located to be substantially coincident with each other. Lengths of the narrow electrode 110a and the narrow electrode 110c are longer than lengths of the narrow electrode 110b and the narrow electrode 110d. The circular electrode is provided to be in contact with the narrow electrodes 110a, 110b, 110c and 110d, respectively, and provided at a position which is substantially a center of the light emitting device 1a in its top plan view.

The ohmic contact portion 135 is provided within an opening located at a part except a region of the dielectric layer 130 located right under the surface electrode 110 in its plan view.

For example, the ohmic contact portion 135 comprises a circumferential part 135a and plurality of flared portions including a part extending along one side of the light emitting device 1a and a part extending along the diagonal line of the light emitting device 1a in its top plan view. For example, a flared portion 135b includes a part extending along the narrow wire electrode 110d and a part extending along the narrow wire electrode 110a. Similarly, a flared portion 135c includes a part extending along the narrow wire electrode 110a and a part extending along the narrow wire electrode 110c.

Second Variation of the Embodiment

Figure 5A:
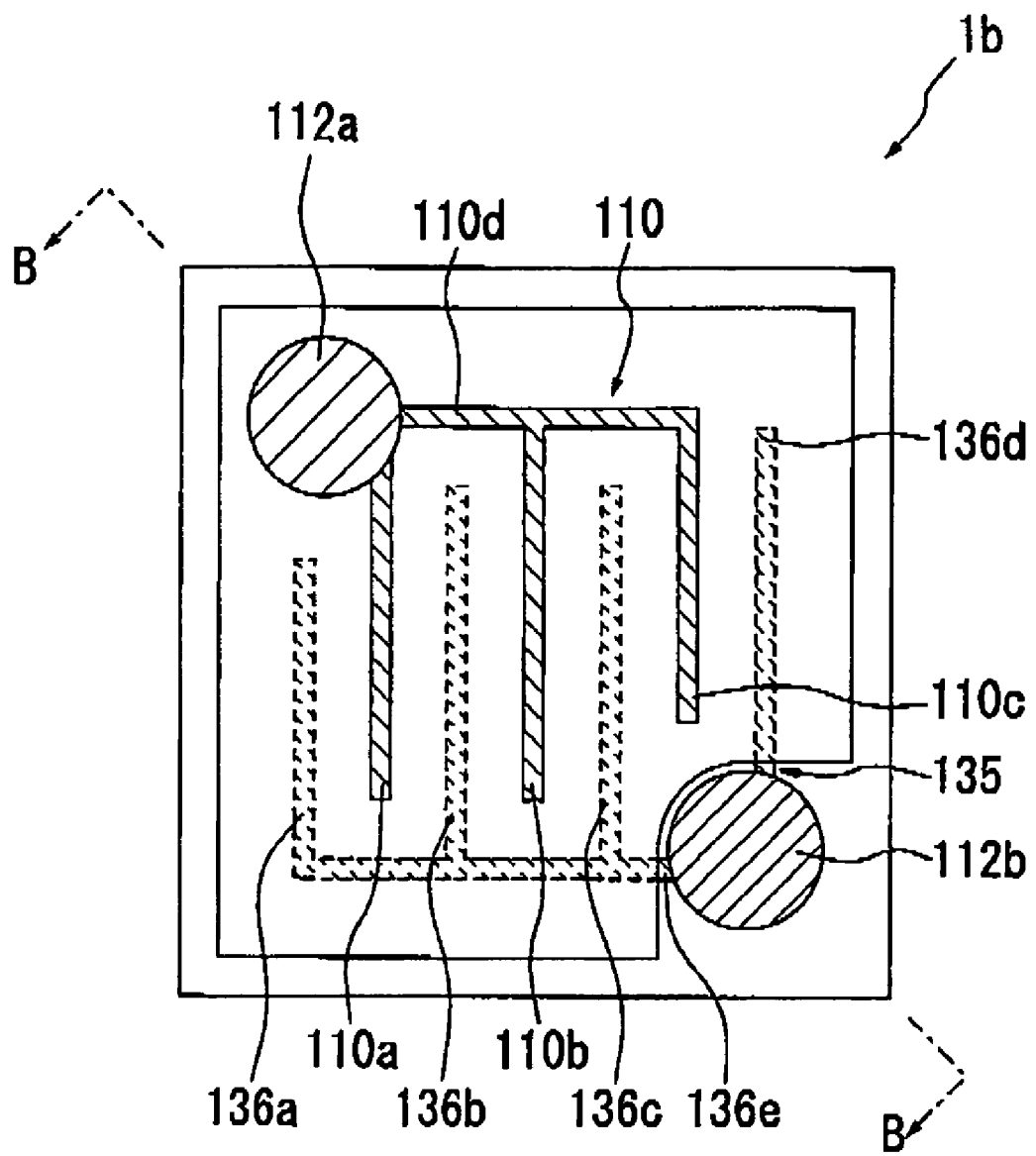
FIG. 5A is a schematic top plan view of a light emitting device in a second variation of the embodiment according to the invention.
Figure 5B:
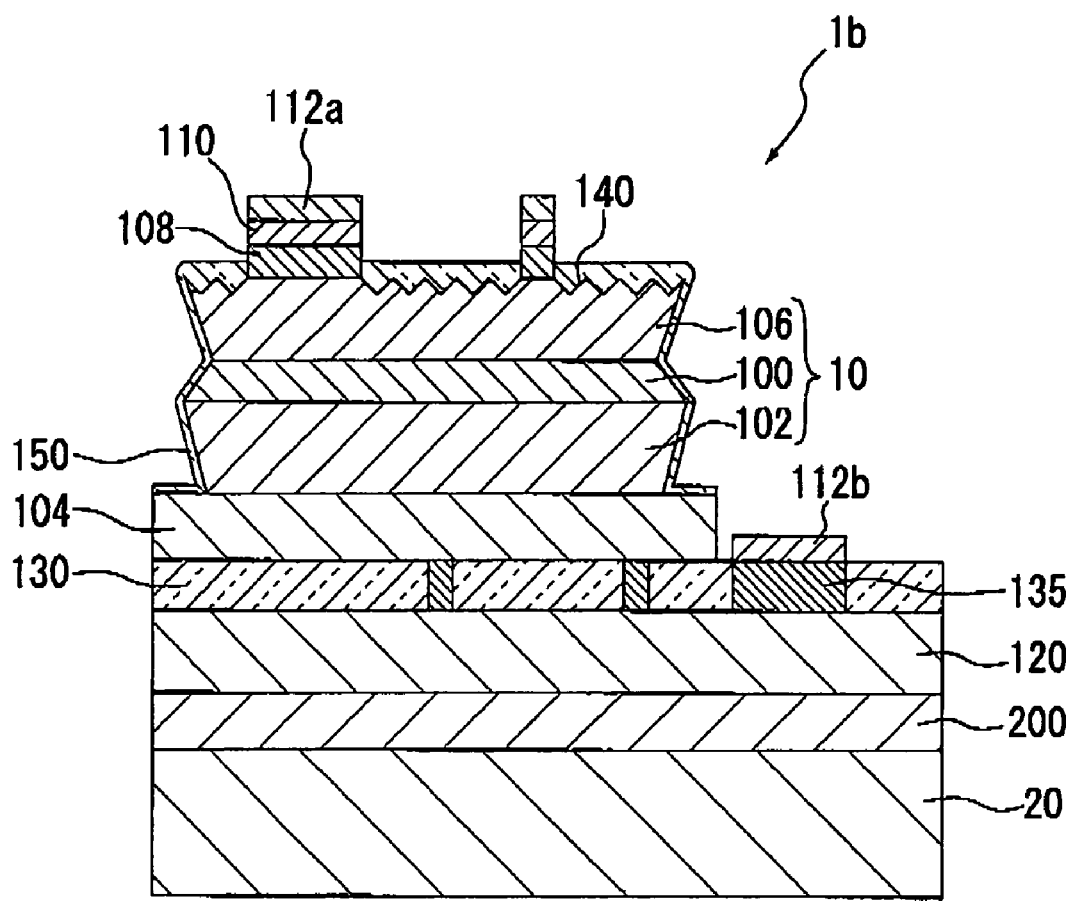
FIG. 5B is a cross sectional view of the light emitting device in the second variation of the embodiment according to the invention.

FIG. 5A is a schematic top plan view of a light emitting device in a second variation of the embodiment according to the invention. FIG. 5B is a cross sectional view of the light emitting device in the second variation of the embodiment according to the invention. Herein, FIG. 5B shows the cross sectional view along B-B line of FIG. 5A.

The light emitting device 1b in the second variation of the embodiment according to the present invention has a configuration substantially similar to that of the light emitting device 1 in the embodiment, except electric current is supplied from a top surface side of the light emitting device 1b. Therefore, detailed explanation thereof is omitted except dissimilarities therebetween. Herein, the light emitting device 1b in the second variation of the embodiment is also referred to as a top surface two-electrode type light emitting device.

Referring to FIG. 5B, the light emitting device 1b in the second variation of the embodiment comprises a light emitting layer 10, a surface electrode 110 which is electrically connected to an n-type contact layer 108 provided on a part of one surface of the light emitting layer 10, a first pad electrode 112a provided as a wire-bonding pad on a part of the surface of the surface electrode 110, and an ohmic contact portion 135 which is in ohmic contact with a part of a p-type contact layer 104 provided on other surface of the light emitting layer 10, a dielectric layer 130 provided to be in contact with the p-type contact layer 104 except a region where the ohmic contact portion 135 is provided, and a reflecting layer 120 provided on a surface of the ohmic contact portion 135 and a surface of the dielectric layer 130 on an opposite side with respect to the light emitting layer 10.

The supporting substrate 20 in the second variation of the embodiment may comprise a material does not have electrical conductivity, such as glass substrate, sapphire substrate.

In the light emitting device 1b in the second variation of the embodiment, a part of the light emitting layer 10, a part of the n-type contact layer 108, and a part of the p-type contact layer 104 are removed to provide a removed region extending from a side of the n-type contact layer 108 to a side of the p-type contact layer 104. A second pad electrode 112b is provided on the ohmic contact portion 135 corresponding to the removed region. According to this step, a surface of the first pad electrode 112a and a surface of the second pad electrode 112b are exposed toward the same orientation. In other words, the second pad electrode 112b is provided on a part of the ohmic contact portion 135 which is exposed to the outside in the region where the light emitting layer 10, the n-type contact layer 108 and the p-type contact layer 104 are removed. According to this structure, electric current supplied to the second pad electrode 112b is supplied to the active layer 100 of the light emitting layer 10 through the ohmic contact portion 135.

(Position Relationship Between Electrodes)

Referring to FIG. 5A, the surface electrode 110 comprises a circular electrode having a substantially circular shape and a plurality of linear (narrow) electrodes that are electrically connected to the circuit electrode on the n-type contact layer 101. The circular electrode is not shown in FIG. 5A, since the circular electrode is located right under the first pad electrode 112a.

The surface electrode 110 is provided to be in contact with the n-type contact layer 108. For example, the surface electrode 101 has a circular shape in its top plan view. As an example, the surface electrode 110 comprises a narrow electrode 110a located in vicinity of one side of the light emitting device 1b, the narrow electrode 110a being substantially horizontal with the one side of the light emitting device 1b, a narrow electrode 110c located in vicinity of an opposite side of the one side of the light emitting device 1, the narrow electrode 110c being substantially horizontal with the opposite side, and a narrow electrode 110b provided between the narrow electrode 110a and the narrow electrode 110c to be substantially equidistant from both of the narrow electrode 110a and the narrow electrode 110c.

The surface electrode 110 further comprises a narrow electrode 110d extending along a direction substantially perpendicular to longitudinal directions of the narrow electrode 110a, the narrow electrode 110b and the narrow electrode 110c, the narrow electrode 110d electrically connecting the narrow electrodes 110a, 110b, and 110c at ends of the narrow electrodes 110a, 110b, and 110c, respectively, and the circular electrode provided right under a region where the first pad electrode 112a is provided. In its plan view, there is no ohmic contact portion 135 which corresponds to the narrow electrode 110d. A length of the narrow electrode 110a is substantially equal to a length of the narrow electrode 110b. A length of the narrow electrode 110c provided at a most distant position from the first pad electrode 112a is formed to be shorter than the length of the narrow electrode 110a and the length of the narrow electrode 110b. In addition, the surface electrode 110 comprises the circular electrode in a region including an intersection point of the narrow electrode 110b and the narrow electrode 110d.

The ohmic contact portion 135 is provided within an opening formed in the dielectric layer 130, and provided in a region except a region right under the surface electrode 110 in accordance with configuration of the surface electrode 110 in its top plan view. The ohmic contact portion 135 is formed at such a position that a distance between the surface electrode 110 and the ohmic contact portion 135 is substantially constant, for the purpose of dispersing the electric current substantially uniformly between the surface electrode 110 an the ohmic contact portion 135.

Further, the ohmic contact portion 135 has a substantially comb shape similarly to that of the surface electrode 110. As an example, the ohmic contact portion 135 comprises a linear portion 136a located in vicinity of one side of the light emitting device 1b, the linear portion 136a being substantially horizontal with the one side of the light emitting device 1b, a linear portion 136d located in vicinity of an opposite side of the one side of the light emitting device 1, the linear portion 136d being substantially horizontal with the opposite side, a linear portion 136b provided in vicinity of the linear portion 136a as compared to the linear portion 136d, and a linear portion 136c provided in vicinity of the linear portion 136d as compared to the linear portion 136a.

The ohmic contact portion 135 further comprises a linear portion 136e extending along a direction substantially perpendicular to longitudinal directions of the linear portion 136a, the linear portion 136b, the linear portion 136c, and the linear portion 136d, the linear portion 136e electrically connecting the linear portions 136a, 136b, 136c, and 136d at ends of the linear portions 136a, 136b, 136c, and 136d, respectively, and a circular portion provided right under a region where the second pad electrode 112b is provided. Herein, the circular portion of the ohmic contact portion 135 is not shown in FIG. 5A, since the circular portion is provided right under the second pad electrode 112b.

A length of the linear portion 136a is formed to be shorter than other linear portions and a length of the linear portion 136d is formed to be longer than other linear portions. A length of the linear portion 136b is substantially equal to a length of the linear portion 136c. The linear portions 136a, 136b, 136c, and 136d are disposed at a substantially equal pitch. The ohmic contact portion 135 comprises the circular portion in a region including an intersection point of the linear portion 136d and the linear portion 136e, and the circular portion is provided in a position diagonal to the first pad electrode 112a in a top plan view of the light emitting device 1b.

The linear part 136a and the linear part 136b are located to sandwich the narrow electrode 110a. As an example, each of the first pad electrode 112a and the second pad electrode 112b is formed to have a circular shape with a diameter of 100 μm. Each of the narrow (linear) electrodes and the linear parts are formed to have a linear shape with a width of 10 μm.

EXAMPLES

Example 1

A light emitting device in Example 1 was fabricated in accordance with the fabrication process of the light emitting device 1 in the embodiment (e.g. see FIGS. 3A to 3M). Namely, a light emitting device comprising an n-type contact layer 108 comprising a Si-doped n-type GaAs, a light emitting layer 10, and a p-type contact layer 104 comprising a Mg-doped p-type GaP, in which the light emitting layer comprises an n-type cladding layer 106 comprising a Si-doped n-type $(Al_{0.7}Ga_{0.3})_{0.5}In_{0.5}P$, an active layer 100 comprising an undoped $(Al_{0.7}Ga_{0.9})_{0.5}In_{0.5}P$, and a p-type cladding layer 102 comprising a Mg-doped p-type $(Al_{0.7}Ga_{0.3})_{0.5}In_{0.5}P$, was fabricated. In the light emitting device in Example 1, convexo-concave portions 140 were formed and a $SiO_2$ film with a thickness of 400 nm was formed as an insulating film as described in the description of the embodiment.

Further, following materials were used for the light emitting device in Example 1. An ohmic contact portion 135 was formed from AuZn alloy. A dielectric layer 130 was formed from a $SiO_2$ layer. A reflecting layer 120 was formed from a reflecting film comprising Al, a barrier layer comprising Pt, and a bonding film comprising Au. As a supporting substrate 20, a conductive Si substrate was used. A surface electrode 110 was formed from AuGe/Ni/Au. A pad electrode 112 and a back surface electrode 210 were formed from Ti/Au.

(Relative Light Extraction Efficiency of the Light Emitting Device in Example 1)

Figure 6:
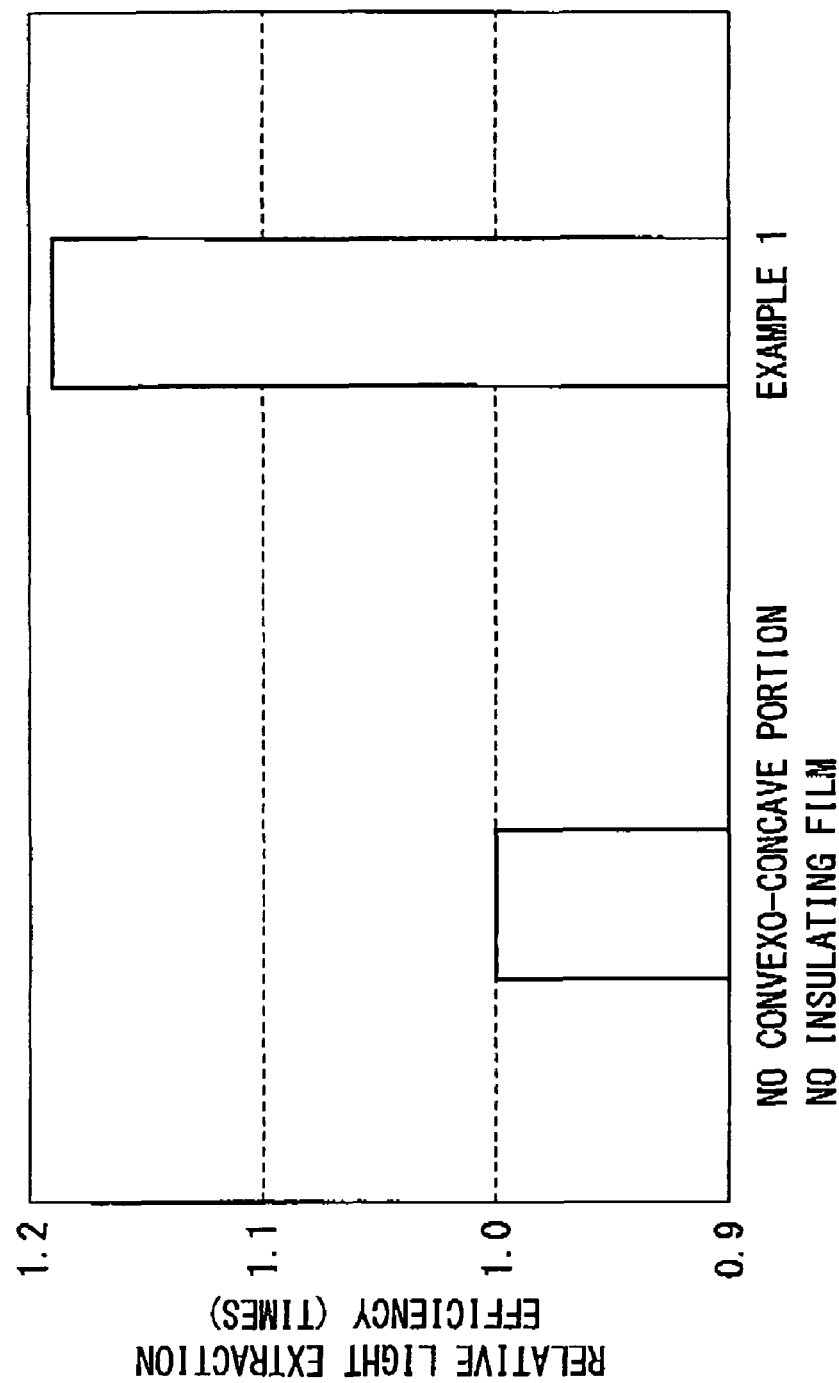
FIG. 6 is a graph showing a relative light extraction efficiency of the light emitting device in Example 1 compared with a light emitting device with no convexo-concave portion and no insulating film as a reference.

FIG. 6 is a graph showing a relative light extraction efficiency of the light emitting device in Example 1 compared with a light emitting device with no convexo-concave portion and no insulating film as a reference.

As a comparative example, a light emitting device having no convexo-concave portion 140 and no insulating film 150 was fabricated. Such a light emitting device has a light emitting device having a configuration similar to the light emitting device in Example 1, from which the convexo-concave portions 140 and the insulating film 150 are removed. As understood from FIG. 6, it is shown that the relative light extraction efficiency of the light emitting device in Example 1 was around 1.19 times greater than the light extraction efficiency of the light emitting device without convexo-concave portion and insulating film.

Example 2

A light emitting device in Example 2 was fabricated to have a similar configuration to the light emitting device in Example 1, except that the insulating film 150 in Example 1 was formed from $Si_3N_4$. The insulating film 150 comprising $Si_3N_4$ was formed by plasma CVD method similarly to the insulating film comprising $SiO_2$.

(Relative Light Extraction Efficiency of the Light Emitting Device in Example 2)

Figure 7:
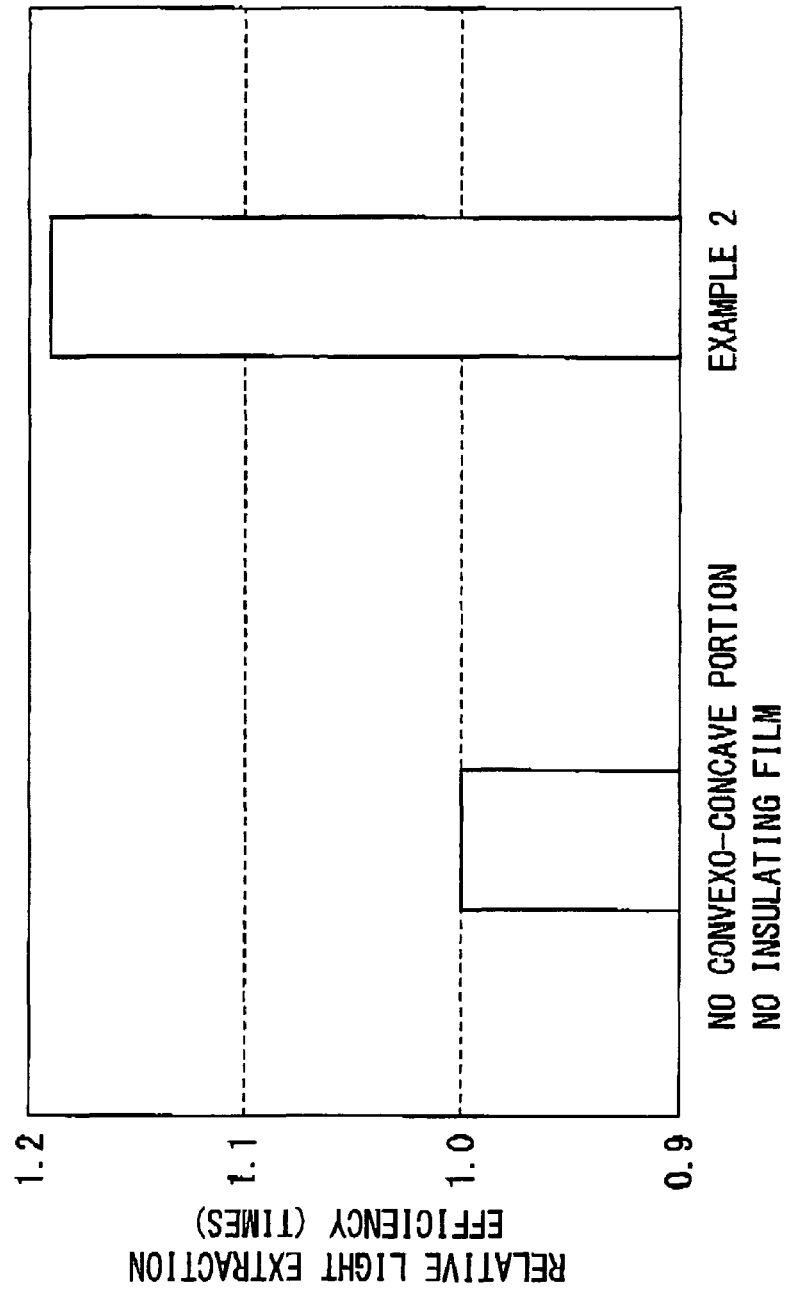
FIG. 7 is a graph showing a relative light extraction efficiency of the light emitting device in Example 2 compared with a light emitting device with no convexo-concave portion and no insulating film as a reference.

FIG. 7 is a graph showing a relative light extraction efficiency of the light emitting device in Example 2 compared with a light emitting device with no convexo-concave portion and no insulating film as a reference.

As a comparative example, a light emitting device having no convexo-concave portion 140 and no insulating film 150 was fabricated. Such a light emitting device has a light emitting device having a configuration similar to the light emitting device in Example 2, from which the convexo-concave portions 140 and the insulating film 150 are removed. As understood from FIG. 7, it is shown that the relative light extraction efficiency of the light emitting device in Example 2 was around 1.19 times greater than the light extraction efficiency of the light emitting device without convexo-concave portion and insulating film.

Example 3

A light emitting device in Example 3 was fabricated to have a similar configuration to the light emitting device in Example 1, except that the insulating film 150 has a multilayer structure comprising a first film and a second film. The first film was formed from $SiO_2$. The second film was formed from $Si_3N_4$ and provided on the first film. The second film was formed by plasma CVD method similarly to the first film.

(Relative Light Extraction Efficiency of the Light Emitting Device in Example 3)

Figure 8:
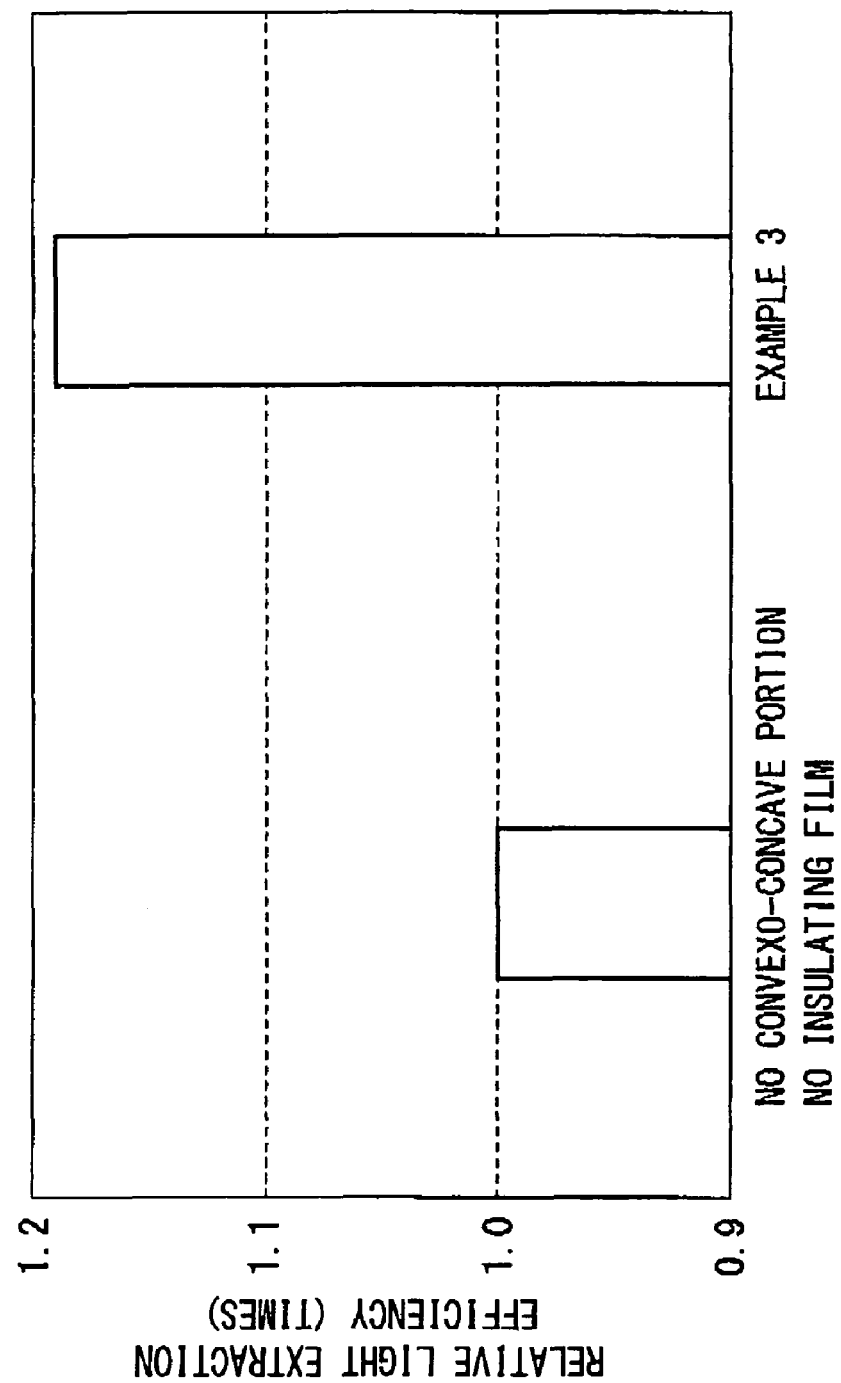
FIG. 8 is a graph showing a relative light extraction efficiency of the light emitting device in Example 3 compared with a light emitting device with no convexo-concave portion and no insulating film as a reference.

FIG. 8 is a graph showing a relative light extraction efficiency of the light emitting device in Example 3 compared with a light emitting device with no convexo-concave portion and no insulating film as a reference.

As a comparative example, a light emitting device having no convexo-concave portion 140 and no insulating film 150 was fabricated. Such a light emitting device has a light emitting device having a configuration similar to the light emitting device in Example 3, from which the convexo-concave portions 140 and the insulating film 150 are removed. As understood from FIG. 8, it is shown that the relative light extraction efficiency of the light emitting device in Example 3 was around 1.19 times greater than the light extraction efficiency of the light emitting device without convexo-concave portion and insulating film.

Example 4

A light emitting device in Example 4 was fabricated to have a similar configuration to the light emitting device in Example 1, except that the insulating film 150 has a multilayer structure comprising a first film and a second film. The first film was formed from $Si_3N_4$. The second film was formed from $SiO_2$ and provided on the first film.

(Relative Light Extraction Efficiency of the Light Emitting Device in Example 4)

FIG. 9 is a graph showing a relative light extraction efficiency of the light emitting device in Example 4 compared with a light emitting device with no convexo-concave portion and no insulating film as a reference.

As a comparative example, a light emitting device having no convexo-concave portion 140 and no insulating film 150 was fabricated. Such a light emitting device has a light emitting device having a configuration similar to the light emitting device in Example 4, from which the convexo-concave portions 140 and the insulating film 150 are removed. As understood from FIG. 9, it is shown that the relative light extraction efficiency of the light emitting device in Example 3 was around 1.19 times greater than the light extraction efficiency of the light emitting device without convexo-concave portion and insulating film.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A light emitting device, comprising:
   a light emitting layer having a first semiconductor layer of a first conductivity type, a second semiconductor layer of a second conductivity type different from the first conductivity type, and an active layer sandwiched between the first semiconductor layer and the second semiconductor layer;
   a reflecting layer provided on a side of a lower-main surface of the light emitting layer, which reflects a light emitted from the active layer;
   a contact layer of the first conductivity type provided between the light emitting layer and the reflecting layer;
   a supporting substrate provided on an opposite side of the reflecting layer with respect to the light emitting layer, which supports the light emitting layer via an adhesion layer;
   an ohmic contact portion provided on a part of the reflecting layer, which electrically connects the reflecting layer with the light emitting layer;
   convexo-concave portions formed on an upper-main surface of the light emitting layer and side surfaces of the light emitting layer, respectively;
   insulating films that cover the convexo-concave portions and a peripheral region of a light extracting surface of the contact layer of the first conductivity type, wherein a width of the insulating films over the upper-main surface of the light emitting layer is less than a width of the supporting substrate; and
   a surface electrode provided on an opposite side of the light emitting layer with respect to the reflecting layer,
   wherein the ohmic contact portion is formed on a part of a region except a region right under the surface electrode when viewed from the upper-main surface of the light emitting layer toward the active layer.

2. The light emitting device according to claim 1, wherein the insulating films transmit the light emitted from the active layer.

3. The light emitting device according to claim 1, wherein the light emitting layer comprises a mesa structure and a reverse mesa structure, and the insulating films are provided along the mesa structure and the reverse mesa structure.

4. The light emitting device according to claim 1, further comprising:
   a dielectric layer provided between the reflecting layer and the light emitting layer, which transmits the light emitted from the active layer,
   wherein the ohmic contact portion is formed within an opening penetrating through a part of the dielectric layer, and electrically connects the contact layer with the reflecting layer.

5. The light emitting device according to claim 1, wherein the insulating films comprise insulating layers having refractive indices different from each other, and the insulating layers are laminated such that the refractive indices of the insulating layers are reduced in a sequential order along a direction distant from the upper-main surface of the light emitting layer and the side surfaces of the light emitting layer.

6. The light emitting device according to claim 1, wherein, with respect to the active layer, the peripheral region is located on the upper main surface of the contact layer.

7. The light emitting device according to claim 1,
   wherein the lower main surface of the light emitting layer is disposed on the contact layer, and
   wherein the contact layer is disposed on a surface of the ohmic contact portion.

8. A light emitting device, comprising:
   a light emitting layer having a first semiconductor layer of a conductivity type, a second semiconductor layer of a second conductivity type different from the first conductivity type, and an active layer sandwiched between the first semiconductor layer and the second semiconductor layer;
   a reflecting layer provided on a side of a lower-main surface of the light emitting layer, which reflects a light emitted from the active layer;
   a contact layer of the first conductivity type provided between the light emitting layer and the reflecting layer;
   a supporting substrate provided on an opposite side of the reflecting layer with respect to the light emitting layer, which supports the light emitting layer via an adhesion layer;
   an ohmic contact portion provided on a part of the reflecting layer, which electrically connects the reflecting layer with the light emitting layer;
   convexo-concave portions formed on an upper-main surface of the light emitting layer and side surfaces of the light emitting layer, respectively; and
   insulating films that cover the convexo-concave portions and a peripheral region of a light extracting surface of the contact layer of the first conductivity type,
   wherein a width of the insulating films over the upper-main surface of the light emitting layer is less than a width of the supporting substrate, and
   wherein the insulating films end at an edge of the light extracting surface of the contact layer of the first conductivity type above side edges of the contact layer of the first conductivity type.

9. The light emitting device according to claim 8, wherein the insulating films transmit the light emitted from the active layer.

10. The light emitting device according to claim 8, wherein the light emitting layer comprises a mesa structure and a reverse mesa structure, and the insulating films are provided along the mesa structure and the reverse mesa structure.

11. The light emitting device according to claim 8, further comprising:

a dielectric layer provided between the reflecting layer and the light emitting layer, which transmits the light emitted from the active layer, wherein the ohmic contact portion is formed within an opening penetrating through a part of the dielectric layer, and electrically connects the contact layer with the reflecting layer.

12. The light emitting device according to claim 8, wherein the insulating films comprise insulating layers having refractive indices different from each other, and the insulating layers are laminated such that the refractive indices of the insulating layers are reduced in a sequential order along a direction distant from the upper-main surface of the light emitting layer and the side surfaces of the light emitting layer.

13. The light emitting device according to claim 8, wherein the insulating films are disposed on the light extracting surface of the contact layer of the first conductivity type.

14. The light emitting device according to claim 8, wherein, with respect to the active layer, the peripheral region is located on the upper-main surface of the light emitting layer.

15. The light emitting device according to claim 8,
wherein the lower main surface of the light emitting layer is disposed on the contact layer, and
wherein the contact layer is disposed on a surface of the ohmic contact portion.

* * * * *